(12) United States Patent
Nagata

(10) Patent No.: US 10,930,771 B2
(45) Date of Patent: Feb. 23, 2021

(54) SEMICONDUCTOR DEVICE HAVING AN INSULATED GATE BIPOLAR TRANSISTOR AND METHOD OF MANUFACTURING THE SAME

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 75 days.

(21) Appl. No.: 16/154,523

(22) Filed: Oct. 8, 2018

(65) Prior Publication Data
US 2019/0181254 A1 Jun. 13, 2019

(30) Foreign Application Priority Data
Dec. 7, 2017 (JP) .............................. JP2017-235557

(51) Int. Cl.
*H01L 29/76* (2006.01)
*H01L 29/739* (2006.01)
(Continued)

(52) U.S. Cl.
CPC ...... *H01L 29/7397* (2013.01); *H01L 21/8249* (2013.01); *H01L 27/0716* (2013.01); *H01L 29/0619* (2013.01); *H01L 29/0696* (2013.01); *H01L 29/0804* (2013.01); *H01L 29/0821* (2013.01); *H01L 29/1095* (2013.01); *H01L 29/401* (2013.01); *H01L 29/407* (2013.01); *H01L 29/417* (2013.01); *H01L 29/41708* (2013.01); *H01L 29/4236* (2013.01); *H01L 29/66348* (2013.01); *H01L 29/7396* (2013.01); *H03K 17/567* (2013.01);
(Continued)

(58) Field of Classification Search
None
See application file for complete search history.

(56) References Cited

U.S. PATENT DOCUMENTS 7,633,122 B2 12/2009 Otsuki
8,633,510 B2 1/2014 Matsuura et al.
(Continued)

FOREIGN PATENT DOCUMENTS

JP 2006-210547 A 8/2006
JP 2012-256839 A 12/2012
(Continued)

*Primary Examiner* — Hung K Vu
(74) *Attorney, Agent, or Firm* — McDermott Will & Emery LLP

(57) ABSTRACT

Performance of a semiconductor device is improved. An active cell region has a first gate electrode that extends in a Y direction and receives a gate potential, and a second gate electrode that extends in the Y direction and receives an emitter potential. A hybrid cell region including a p-type base region and an n-type emitter region is disposed in the active cell region. An n-type isolation region adjacent to the hybrid cell region in the Y direction is formed in the active cell region excluding the hybrid cell region. Hence, even if the p-type base region or a p-type floating region is formed in the active cell region excluding the hybrid cell region, such a p-type region is isolated from the base region in the hybrid cell region by the isolation region.

13 Claims, 42 Drawing Sheets

(51) Int. Cl.
*H01L 29/10* (2006.01)
*H01L 29/06* (2006.01)
*H01L 29/66* (2006.01)
*H01L 29/423* (2006.01)
*H01L 27/07* (2006.01)
*H01L 29/08* (2006.01)
*H01L 21/8249* (2006.01)
*H01L 29/417* (2006.01)
*H03K 17/567* (2006.01)
*H01L 29/40* (2006.01)
*H01L 29/78* (2006.01)
*H01L 27/088* (2006.01)

(52) U.S. Cl.
CPC ........ *H01L 27/088* (2013.01); *H01L 29/4238* (2013.01); *H01L 29/7827* (2013.01)

(56) References Cited

U.S. PATENT DOCUMENTS

| | | |
|---|---|---|
| 9,099,522 B2 | 8/2015 | Onozawa |
| 9,818,851 B2 | 11/2017 | Nagata |
| 2017/0117396 A1* | 4/2017 | Matsuura .......... H01L 29/66348 |

FOREIGN PATENT DOCUMENTS

| | | |
|---|---|---|
| JP | 2016-184622 A | 10/2016 |
| WO | 2011/111500 A1 | 9/2011 |

* cited by examiner

A-A SECTION

E-E SECTION

E-E SECTION

A-A SECTION

E-E SECTION

D-D SECTION

E-E SECTION

D-D SECTION

D-D SECTION

A-A SECTION

E-E SECTION

SEMICONDUCTOR DEVICE HAVING AN INSULATED GATE BIPOLAR TRANSISTOR AND METHOD OF MANUFACTURING THE SAME

CROSS-REFERENCE TO RELATED APPLICATIONS

The disclosure of Japanese Patent Application No. 2017-235557 filed on Dec. 7, 2017 including the specification, drawings and abstract is incorporated herein by reference in its entirety.

BACKGROUND

The present invention relates to a semiconductor device and a method of manufacturing the semiconductor device. For example, the invention is preferably used for a semiconductor device having an insulated gate bipolar transistor (IGBT).

A trench-gate IGBT is widely used as an IGBT having a low on resistance, i.e., a low forward saturation voltage VCE(sat), and there has been developed an IE IGBT in which an injection enhancement (IE) effect can be used by alternately arranging active cell regions each including a gate electrode as a gate potential electrode and an emitter region as an emitter potential electrode, and inactive cell regions each including a p-type floating region. The IE effect is to increase concentration of charges stored in a drift region by suppressing hole discharge from an emitter potential electrode side while the IGBT is on. A structure (GG structure), in which two adjacent trench gates are each coupled to a gate potential, and in addition to the GG structure, a structure (GGEE structure) in which the two adjacent trench gates are each further coupled to an emitter potential, have been developed as such an IE IGBT.

Japanese Unexamined Patent Application Publication No. 2016-184622 discloses an EGE structure having three trench gates coupled to an emitter potential, a gate potential, and the emitter potential, respectively, which also discloses disadvantageous generation of a displacement current toward the gate due to a potential variation in a floating region.

Japanese Unexamined Patent Application Publication No. 2012-256839 discloses a technique on an IE IGBT having the GG structure, in which a region having an n-type emitter region is divided in a Y direction in plan view, and the region is surrounded by a trench gate having a gate potential.

Japanese Unexamined Patent Application Publication No. 2006-210547 discloses a technique on an IE IGBT having the GG structure, in which a region having an n-type emitter region is divided in a Y direction in plan view.

International Publication WO 2011/11500 discloses a technique on an IE IGBT having the GG structure, in which a trench gate having an emitter potential is disposed so as to be adjacent to a trench gate having a gate potential.

SUMMARY

In the GC structure, holes are stored in the surface of the floating region formed between the respective trench gates coupled to a gate potential, and a potential of the floating region varies due to the holes with a variation in a collector voltage during switching operation. A displacement current toward a gate is generated by such a variation in potential of the floating region, which disadvantageously causes an increase in switching loss, a reduction in breakdown strength, current fluctuation, voltage fluctuation, and surge.

To meet such difficulties, for the GGEE structure and the EGE structure, a parasitic p-type metal oxide semiconductor field effect transistor (MOSFET) is formed by a trench gate coupled to an emitter potential, and holes can be discharged by the parasitic p-type MOSFET to suppress the variation in potential of the floating region.

However, an excessively large hole discharge effect of the parasitic p-type MOSFET reduces the IE effect, and thus switching loss of IGBT tends to increase.

Other objects and novel features will be clarified from the description of this specification and the accompanying drawings.

Among the embodiments disclosed in this application, typical ones are briefly summarized as follows.

A semiconductor device as one embodiment includes a first region extending in a first direction in plan view, a second region different from the first region, a third region disposed in the first region, and a fourth region disposed in the first region so as to be adjacent to the third region in the first direction. The semiconductor device further includes a first impurity region having a first conductivity type formed in a semiconductor substrate, a first trench and a second trench that are formed in the first impurity region in the first region and extend in the first direction, a first gate electrode formed so as to be buried in the first trench, and a second gate electrode formed so as to be buried in the second trench. The semiconductor device further includes a second impurity region that is formed in the first impurity region in the third region and has a second conductivity type opposite to the first conductivity type, a third impurity region that is formed in the second impurity region in the third region and has the first conductivity type, and a fourth impurity region that is formed in the semiconductor substrate lower than the first impurity region in each of the first and second regions and has the second conductivity type. The semiconductor device further includes a gate potential electrode to supply a gate potential, an emitter potential electrode to supply an emitter potential, and a collector potential electrode to supply a collector potential. The first gate electrode is electrically coupled to the gate potential electrode, the fourth impurity region is electrically coupled to the collector potential electrode, and the second impurity region, the third impurity region, and the second gate electrode are electrically coupled to the emitter potential electrode. The third region includes a plurality of third regions disposed so as to be separated from one another in the first direction, the fourth region is disposed between the respective third regions, and a fifth impurity region having the first conductivity type is formed in the first impurity region in the fourth region while having a higher impurity concentration than the first impurity region.

According to one embodiment, performance of the semiconductor device can be improved.

DETAILED DESCRIPTION

Although each of the following embodiments may be dividedly described in a plurality of sections or embodiments for convenience as necessary, they are not unrelated to one another except for the particularly defined case, and are in a relationship where one is a modification, detailed explanation, supplementary explanation, or the like of part or all of another one. In each of the following embodiments, when the number of elements and others (including the number, a numerical value, amount, and a range) is mentioned, the number is not limited to a specified number except for the particularly defined case and for the case where the number is principally clearly limited to the specified number. In other words, the number may be not less than or not more than the specified number. In each of the following embodiments, a constitutional element (including an element step etc.) of the embodiment is not necessarily indispensable except for the particularly defined case and for the case where the constitutional element is considered to be indispensable in principle. Similarly, in the following embodiment, when a shape of a constitutional element, a positional relationship, and others are described, any configuration substantially closely related to or similar to such a shape or the like should be included except for the particularly defined case and for the case where such a configuration is considered to be not included in principle. The same holds true in the numerical value and the range.

Hereinafter, some embodiments will be described in detail with reference to the accompanying drawings. In all drawings for explaining the embodiments, components having the same function are designated by the same numeral, and duplicated description is omitted. In the following embodiments, the same or similar portion is not repeatedly described in principle except for a particularly required case.

A view for explaining each embodiment may not be hatched for better viewability.

Herein, the p conductivity type of a semiconductor means that only holes are charge carriers, or although both electrons and holes are charge carriers, hole concentration is higher than electron concentration, i.e., holes are major charge carriers. In addition, the n conductivity type of a semiconductor means that only electrons are charge carriers, or although both electrons and holes are charge carriers, electron concentration is higher than hole concentration, i.e., electrons are major charge carriers.

Herein, switching operation of the IGBT from off to on is referred to as "turn-on", and switching operation of the IGBT from on to off is referred to as "turn-off".

First Embodiment

A semiconductor device of a first embodiment is described in detail below with reference to the drawings. The semiconductor device of the first embodiment includes an IE IGBT having a novel structure developed based on the EGE structure.

Configuration of Semiconductor Device

Figure 1:
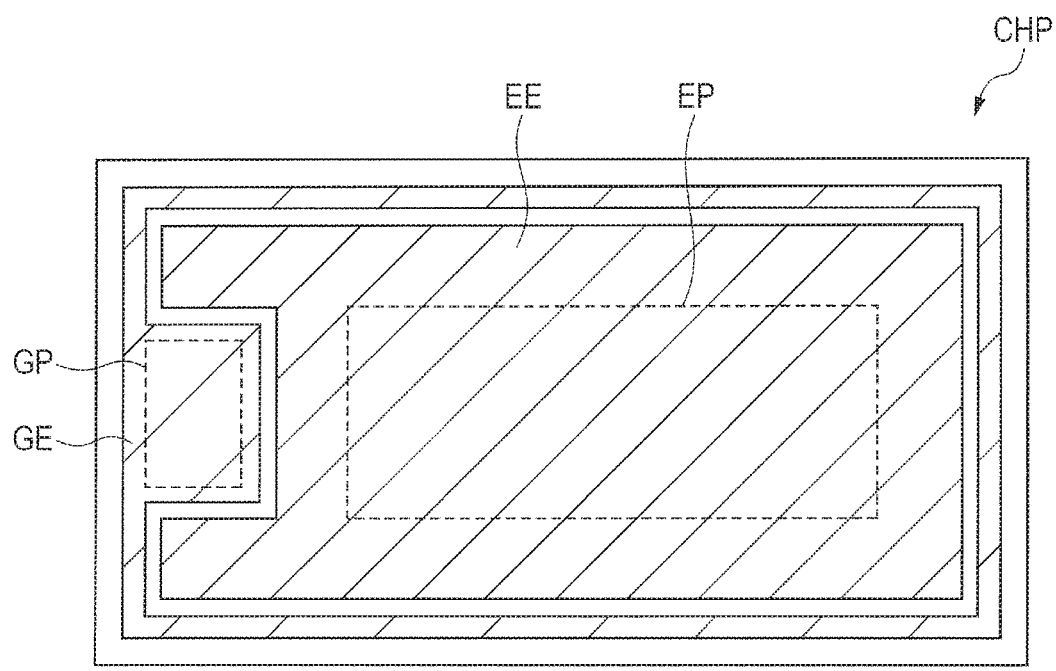
FIG. 1 is a plan view of a semiconductor chip as a semiconductor device of a first embodiment.

FIG. 1 is a plan view of a semiconductor chip CHP as a semiconductor device of the first embodiment. FIG. 1 is a plan view showing an image as seen through an insulating film PIQ (see FIG. 3) while a gate potential electrode GE and an emitter potential electrode EE are hatched for ease in understanding.

As shown in FIG. 1, most of the semiconductor chip CHP is covered with the emitter potential electrode EE, and the gate potential electrode GE is formed in the periphery of the emitter potential electrode EE. A region enclosed by a broken line near the center of the emitter potential electrode EE is an emitter pad EP, and a region enclosed by a broken line in the gate potential electrode GE is a gate pad GP. The insulating film PIQ is removed from on the emitter pad EP and on the gate pad GP, and an external coupling terminal such as a bonding wire or a clip (copper plate) is coupled to on the emitter pad EP and on the gate pad GP to electrically couple the semiconductor chip CHP to another chip or an interconnection substrate.

Figure 2:
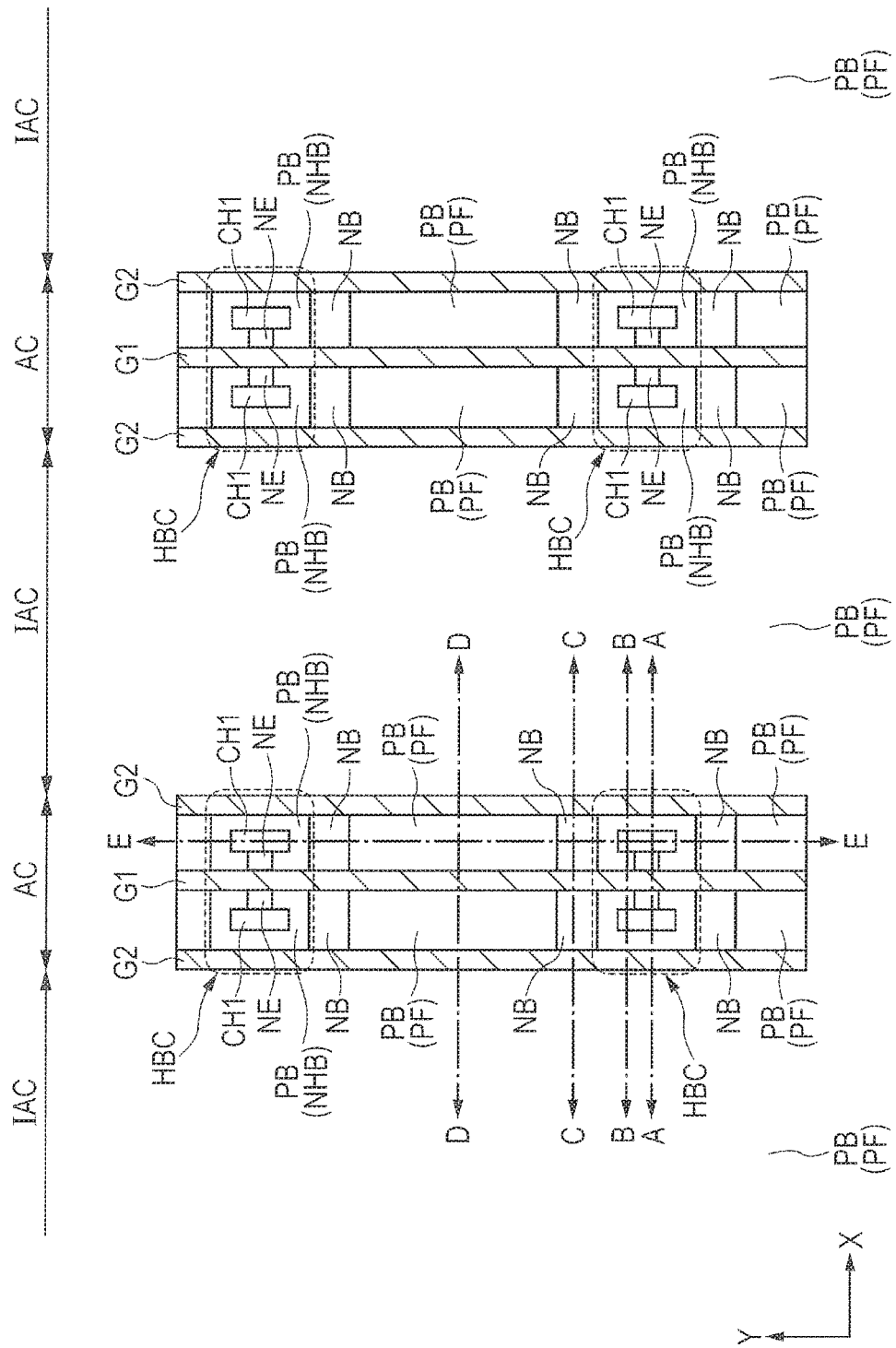
FIG. 2 is a major-part plan view of the semiconductor device of the first embodiment.
Figure 3:
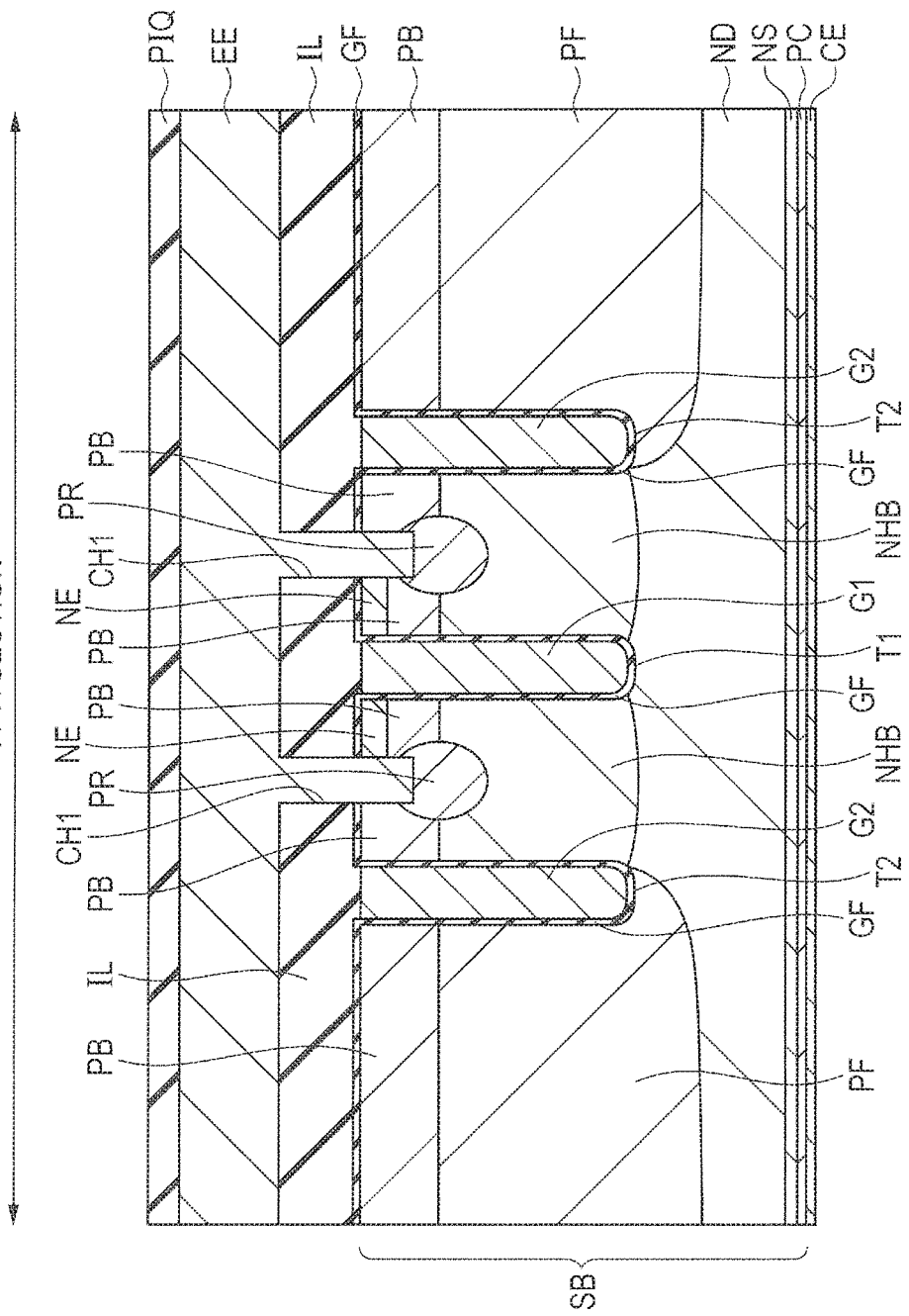
FIG. 3 is a sectional view of the semiconductor device of the first embodiment.
Figure 4:
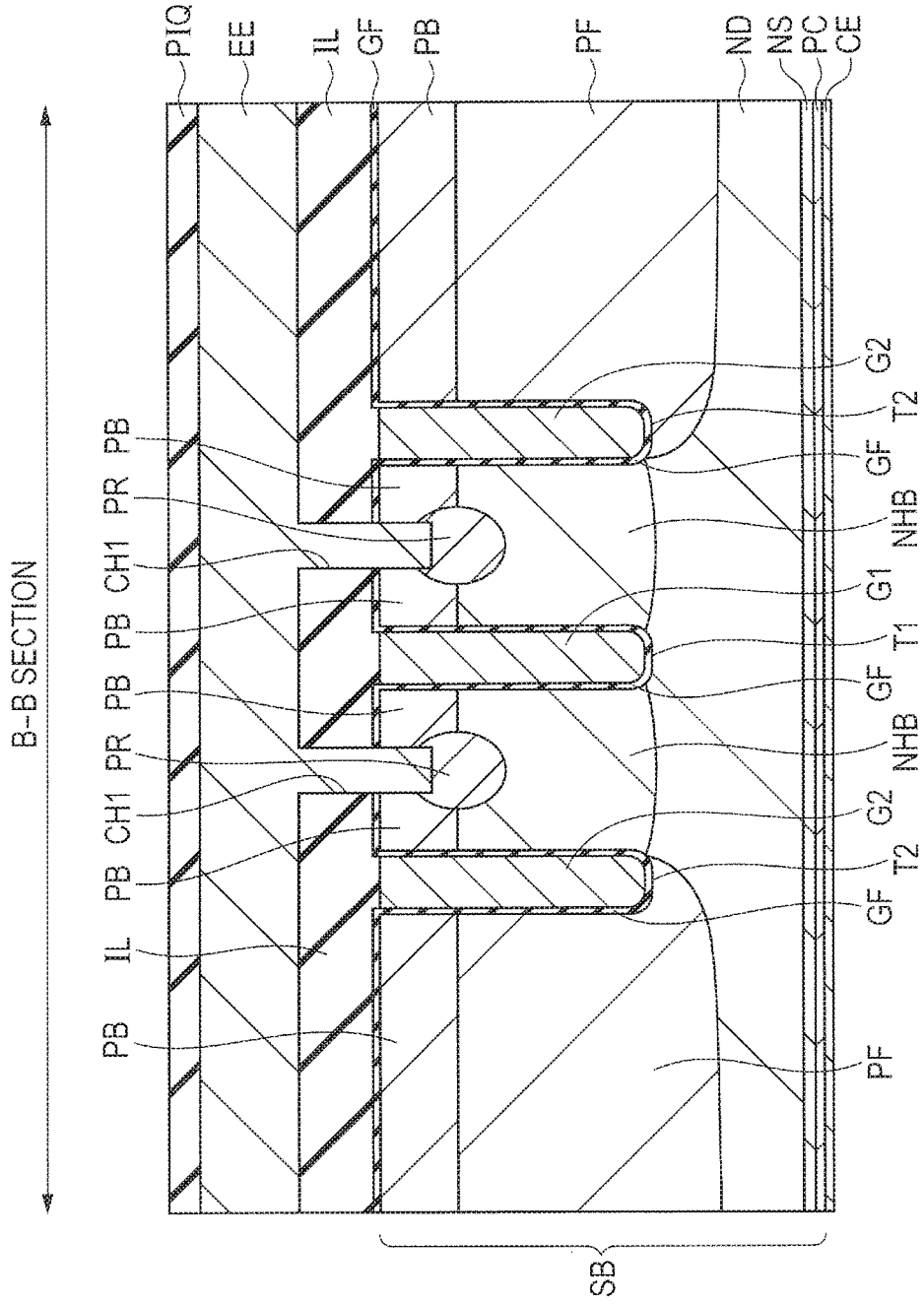
FIG. 4 is a sectional view of the semiconductor device of the first embodiment.
Figure 5:
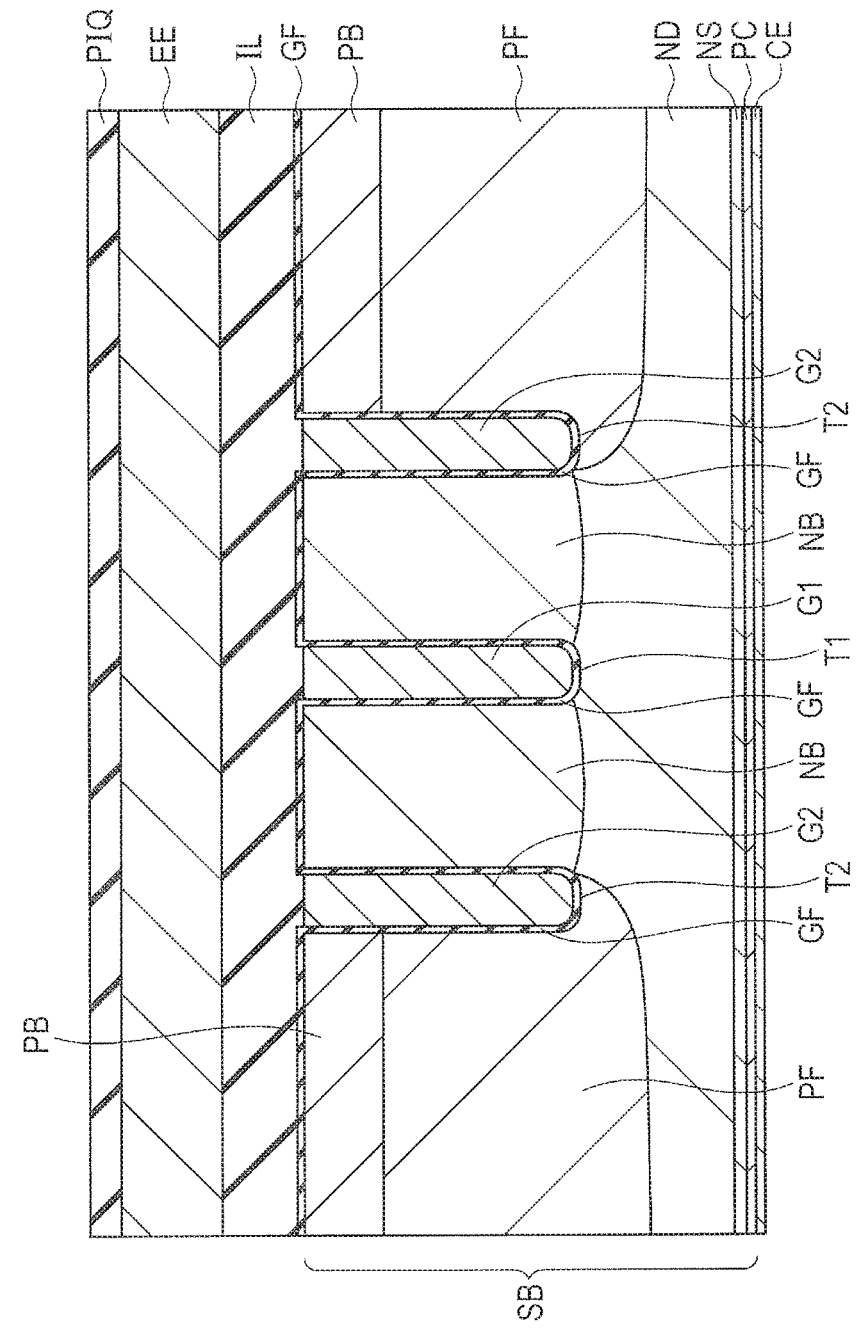
FIG. 5 is a sectional view of the semiconductor device of the first embodiment.
Figure 6:
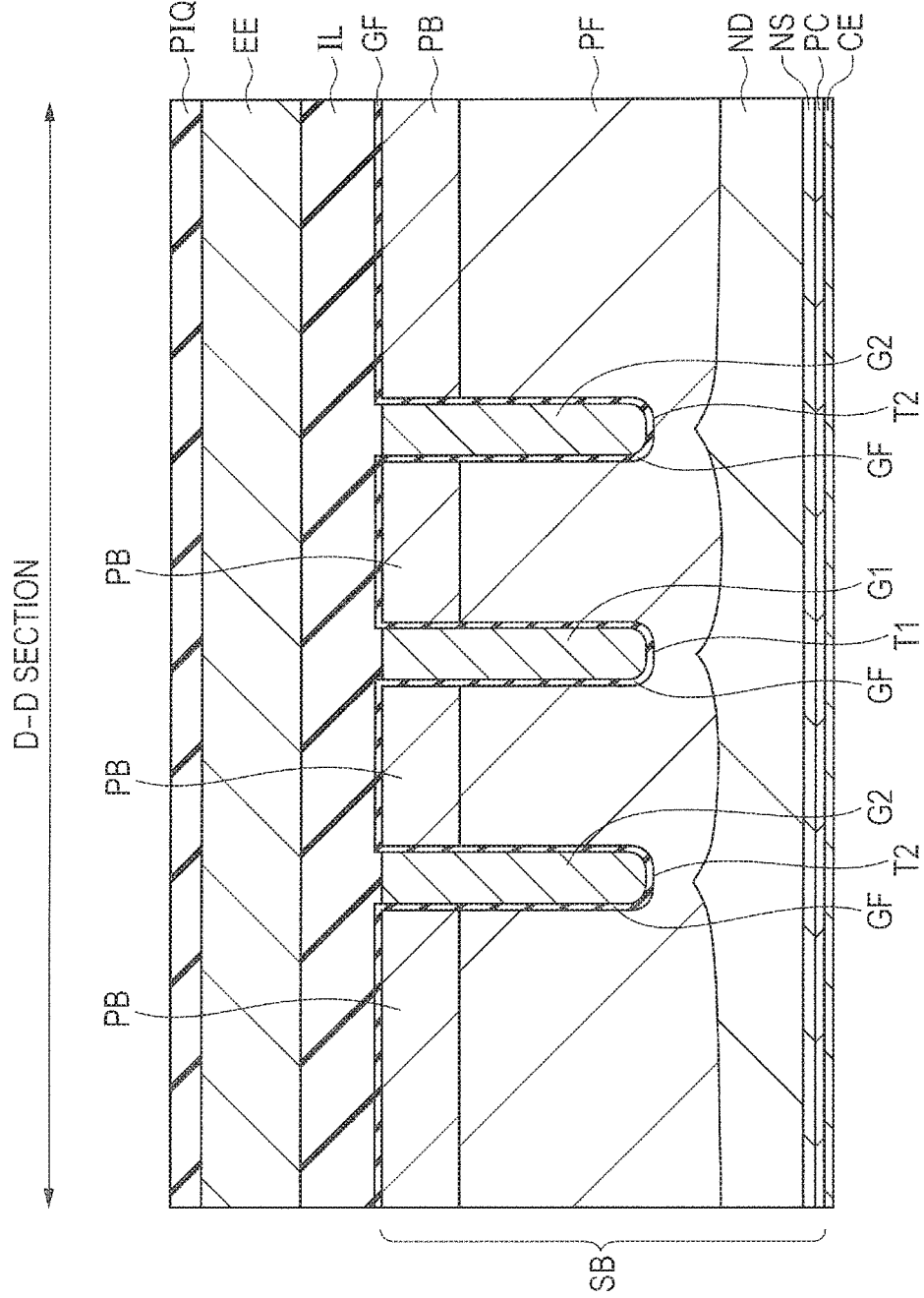
FIG. 6 is a sectional view of the semiconductor device of the first embodiment.
Figure 7:
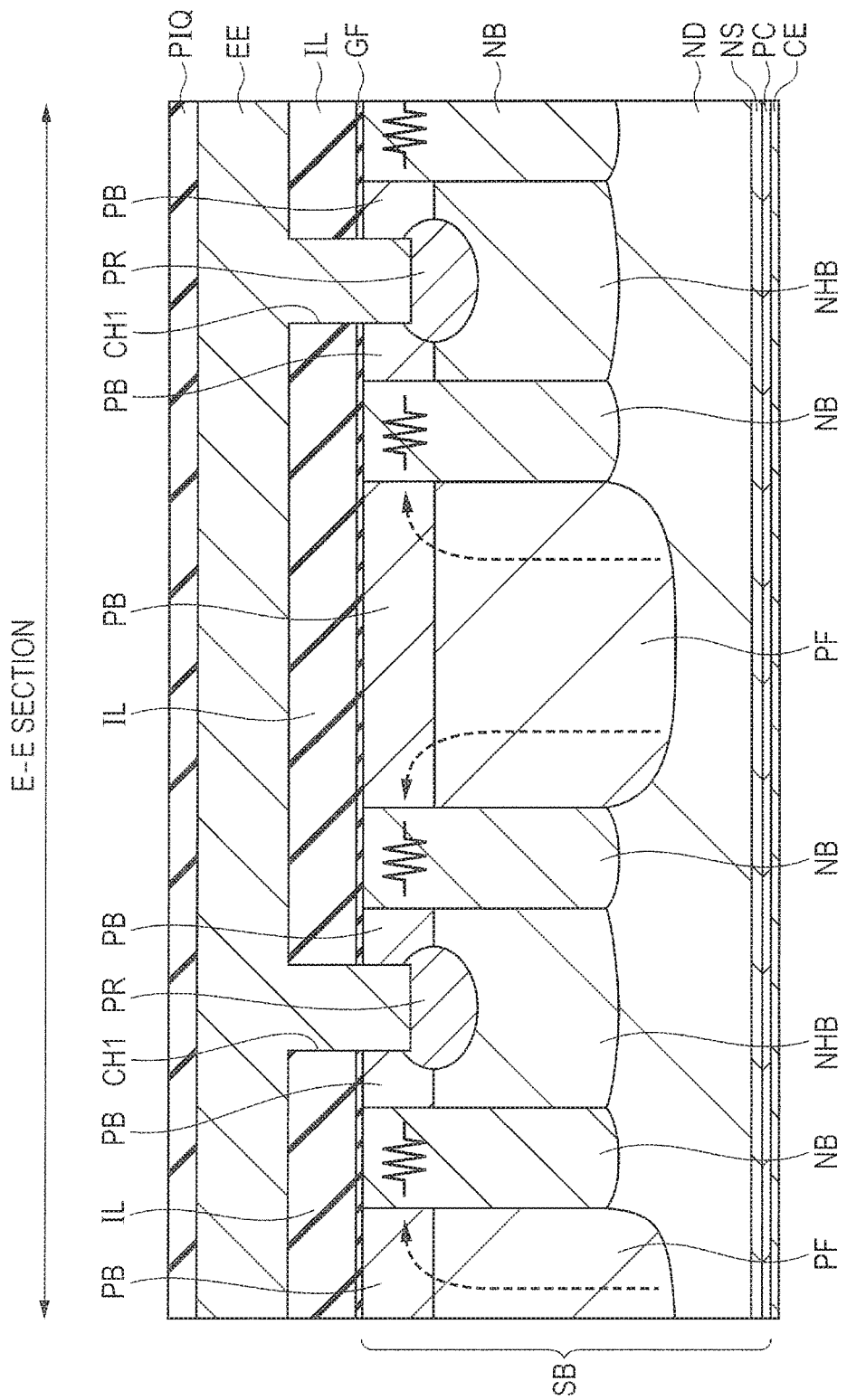
FIG. 7 is a sectional view of the semiconductor device of the first embodiment.

FIG. 2 is a major-part plan view of the semiconductor chip CHP, which corresponds to a plan view below the emitter potential electrode EE. FIG. 3 is a sectional view along a line A-A of FIG. 2, FIG. 4 is a sectional view along a line B-B of FIG. 2, FIG. 5 is a sectional view along a line C-C of FIG. 2, FIG. 6 is a sectional view along a line D-D of FIG. 2, and FIG. 7 is a sectional view along a line E-E of FIG. 2.

Although FIG. 2 is a plan view, each gate electrode G1 and each gate electrode G2 are hatched for better viewability. In FIG. 2, a protective film PIQ, the emitter potential electrode EE, an interlayer insulating film IL, and a gate insulating film GF are not illustrated.

The semiconductor device of the first embodiment includes an active cell region AC including the two gate electrodes G2 as trench gates electrically coupled to the emitter potential electrode EE, and the gate electrode G1 as a trench gate that is formed between the two gate electrodes G2 and electrically coupled to the gate potential electrode GE. The active cell region AC has a plurality of hybrid cell regions HBC as regions configuring a main circuit of an IGBT of the first embodiment.

The semiconductor device of the first embodiment has an inactive cell region IAC other than the active cell region AC. A base region (impurity region) PB and a floating region (impurity region) PF are formed in the inactive cell region IAC.

As shown in FIG. 2, the gate electrode G1 and the gate electrode G2 extend in a Y direction in the active cell region AC. The gate electrode G1 are disposed adjacent to the gate electrode G2 in an X direction orthogonal to the Y direction. While not shown, the gate electrode G1 is coupled to the gate potential electrode GE shown in FIG. 1 in the periphery of the semiconductor chip CHP, and receives a gate potential during operation of the IGBT. The gate electrode G2 is partially led to the outside of a trench T2. Such a led portion of the gate electrode G2 is coupled to the emitter potential electrode EE via a contact hole, thereby an emitter potential is applied to the gate electrode G2 during operation of the IGBT.

The hybrid cell region HBC has the gate electrode G1, the two gate electrodes G2, and an n-type emitter region (impurity region) NE. In the hybrid cell region HBC, a p-type base region (impurity region) PB is formed in the surface of an n-type hole barrier region (impurity region) NHB, and an emitter region NE is formed in the surface of the base region PB.

The emitter region NE and the base region PB are each in contact with a contact hole CH1 in which the emitter potential electrode EE is buried. A p-type body region (impurity region) PR having a higher impurity concentration than the base region PB is formed in a semiconductor substrate SB below the contact hole CH1. The emitter potential is therefore applied to the emitter region NE, the base region PB, and the body region PR during operation of the IGBT.

The emitter region NE is provided between the gate electrode G1 and the contact hole CH1, and is not provided between the gate electrode G2 and the contact hole CH1. In the hybrid cell region HBC, therefore, a region between the gate electrode G1 and the contact hole CH1 mainly configures a circuit of the IGBT, and a region between the gate electrode G2 and the contact hole CH1 mainly configures a parasitic p-type MOSFET1. The parasitic p-type MOSFET1 has a function to discharge holes stored in the floating region PF in the vicinity of a bottom of the gate electrode G2 from the contact hole CH1 during operation of the IGBT. The parasitic p-type MOSFET1 is described in detail later.

In the active cell region AC, the hybrid cell regions HBC are disposed so as to be separated from each other in the Y direction. An n-type isolation region (impurity region) NB, the floating region PF, and the base region PB formed in the surface of the floating region PF are provided in the active cell region AC excluding the hybrid cell regions HBC. The emitter region NE, the contact hole CH1, and the body region PR are not formed in such a region.

The isolation region NB is disposed so as to isolate the hybrid cell region HBC from the floating region PF in the Y direction. In other words, the isolation region NB is disposed so as to isolate the base region PB in the hybrid cell region HBC from the base region PB formed in the surface of the floating region PF in the Y direction. That is, the isolation region NB, the floating region PF as well as the base region PB, and the isolation region NB are provided in order between the two hybrid cell regions HBC adjacent in the Y direction.

In the inactive cell region IAC, while the floating region PF and the base region PB are formed, the emitter region NE, the contact hole CH1, and the body region PR are not formed. A ratio of a width of the active cell region AC to a width of the inactive cell region IAC is 1:2 to 1:3 in the X direction.

A sectional structure of the semiconductor device of the first embodiment is now described with reference to FIGS. 3 to 7.

The semiconductor substrate SB has a drift region (impurity region) ND as a low-concentration n-type impurity region. An n-type field stop region (impurity region) NS having a higher impurity concentration than the drift region ND, a p-type collector region (impurity region) PC, and a collector potential electrode CE including a metal film are formed on a side close to the back of the semiconductor substrate SB with respect to the drift region ND. That is, a collector potential is applied to the collector region PC via the collector potential electrode CE during operation of the IGBT.

A trench T1 and the trench T2 are formed on a surface side of the semiconductor substrate SB. The gate electrode G1 and the gate electrode G2 are provided on the gate insulating film GF within the trenches T1 and T2, respectively, so as to be buried in the trenches. As described above, the gate electrode G1 is coupled to the gate potential electrode GE, and receives the gate potential. The gate electrode G2 is coupled to the emitter potential electrode EE, and receives the emitter potential. The gate insulating film GF includes, for example, a silicon oxide film. The gate electrodes G1 and G2 each includes, for example, a polycrystalline silicon film containing, for example, an n-type impurity introduced therein.

A structure of the hybrid cell region HBC in the active cell region AC is now described with reference to FIGS. 3, 4, and 7.

As shown in FIG. 3, in the hybrid cell region HBC, a hole barrier region NHB having a higher impurity concentration than the drift region ND is formed in the semiconductor substrate SB between the gate electrode G1 and the gate electrode G2, and the p-type base region PB is formed in the surface of the hole barrier region NHB. The emitter region NE is formed in part of the base region PB. The emitter region NE is provided between the gate electrode G1 and the contact hole CH1, and is not provided between the gate electrode G2 and the contact hole CH1. As shown in FIG. 4, the emitter region NE is not provided in some portion between the gate electrode G1 and the contact hole CH1 in the hybrid cell region HBC. As shown in FIG. 7, the emitter region NE is electrically isolated from the base region PB in the Y direction by the isolation region NB.

Part of the gate insulating film GF is formed on the emitter region NE and on the base region PB, and the interlayer insulating film IL is formed on the part of the gate insulating film GF, on the upper surface of the gate electrode G1, and on the upper surface of the gate electrode G2. The contact hole CH1 is formed penetrating through the interlayer insulating film IL, the gate insulating film GF, and part of the semiconductor substrate SB. The contact hole CH1 is formed so as to be in contact with the emitter region NE and the base region PB.

The bottom of the contact hole CH1 is located within the base region PB, and does not reach the hole barrier region NHB. A p-type body region PR having a higher impurity concentration than the base region PB is formed around the bottom of the contact hole CH1. The body region PR is formed so as to stride the base region PB and the hole barrier region NHB while being not in contact with the emitter region NE. The body region PR is provided to reduce a contact resistance with the emitter potential electrode EE buried in the contact hole CH1, and prevent latch-up.

The emitter potential electrode EE is formed on the interlayer insulating film IL while filling the contact hole CH1. In the hybrid cell region HBC, therefore, the emitter potential is applied to the emitter region NE, the base region PB, and the body region PR.

The protective film PIQ made of, for example, a resin such as polyimide is formed on the emitter potential electrode EE. While not shown in FIGS. 3 to 7, the protective film PIQ has openings so as to expose part of the emitter potential electrode EE and part of the gate potential electrode GE. That is, no protective film PIQ is formed in the regions (the gate pad GP and the emitter pad EP) shown by the broken line in FIG. 1.

A structure of the active cell region AC excluding the hybrid cell region HBC is now described with reference to FIGS. 5, 6, and 7.

As shown in FIGS. 5 and 7, the n-type isolation region NB is provided in a region adjacent to the hybrid cell region HBC in the Y direction and between the gate electrodes G1 and G2 in the X direction. The base region PB and the emitter region NE are not formed in the isolation region NB. The contact hole CH1 is also not formed on the isolation region NB. Hence, as shown in FIG. 7, the p-type base region PB in the hybrid cell region HBC is isolated from the base region PB formed in the surface of the p-type floating region PF by the n-type isolation region NB.

The isolation region NB has an impurity concentration higher than that of the hole barrier region NHB. However, when the hole barrier region NHB has a sufficiently high impurity concentration, the hole barrier region NHB may be formed in a region in which the isolation region NB is to be formed while formation of the isolation region NB is omitted. That is, the isolation region NB may be formed by expanding the hole barrier region NHB from within the hybrid cell region HBC to the active cell region AC excluding the hybrid cell region HBC.

As shown in FIGS. 6 and 7, the p-type floating region PF is provided in a region adjacent to the n-type isolation region NB in the Y direction and between the gate electrodes G1 and G2 in the X direction. Although the base region PB is formed in the surface of the p-type floating region PF, the emitter region NE is not formed therein. The contact hole CH1 is also not disposed in the floating region PF.

The floating region PF in the active cell region AC is formed up to a position deeper than the trench T2 in which the gate electrode G2 is buried, and is coupled to the floating region PF in the inactive cell region IAC. This makes it possible to suppress a potential variation due to hole storage in the floating region PF. It is further possible to reduce an electric field in the vicinity of the bottom of the trench T2.

A structure of the inactive cell region IAC is now described.

The inactive cell region IAC is located between the two active cell regions AC in the X direction, and is located between the two gate electrodes G2. The p-type floating region PF is provided over the entire inactive cell region IAC. Although the base region PB is formed in the surface of the p-type floating region PF, the emitter region NE is not formed therein. The contact hole CH1 is also not disposed in the floating region PF.

Although the structure of the first embodiment has been described as above, features and effects of the first embodiment are described in detail after the following description of a method of manufacturing the semiconductor device and description of examination examples.

Method of Manufacturing Semiconductor Device

A method of manufacturing the semiconductor device of the first embodiment is described below with reference to FIGS. 8 to 17. FIGS. 8, 10 to 12, 14, 15, and 17 each illustrate a manufacturing process of the A-A section shown in FIG. 3. FIGS. 9, 13, and 16 each illustrate a manufacturing process of the E-E section shown in FIG. 7.

Figure 8:
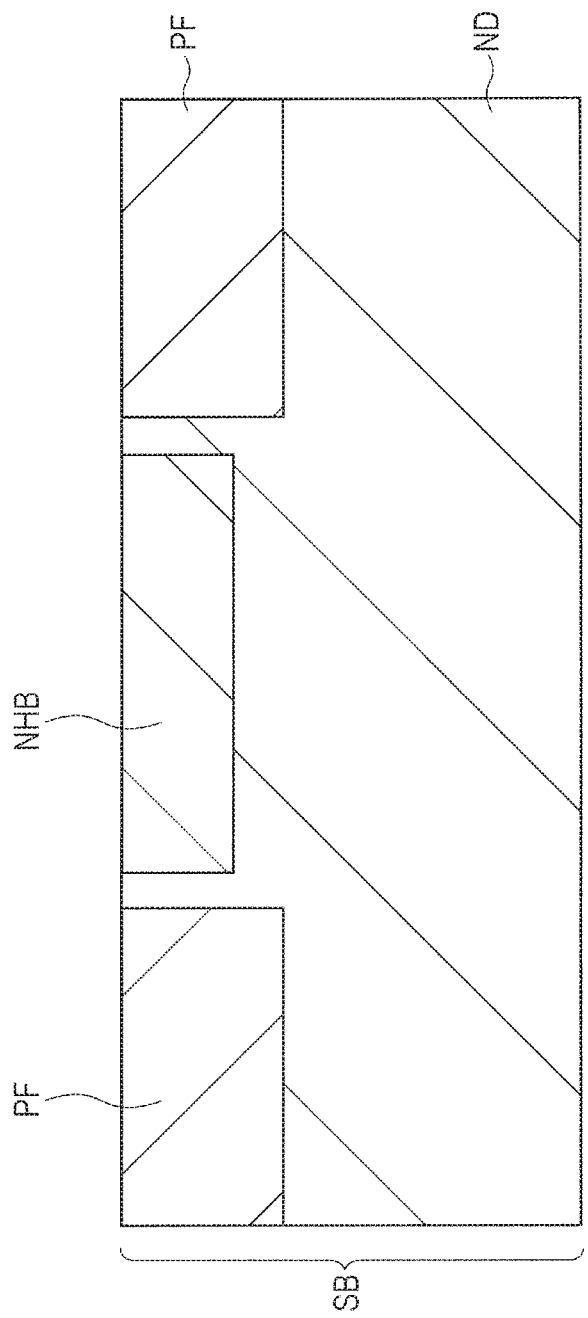
FIG. 8 is a sectional view illustrating a manufacturing process of the semiconductor device of the first embodiment.
Figure 9:
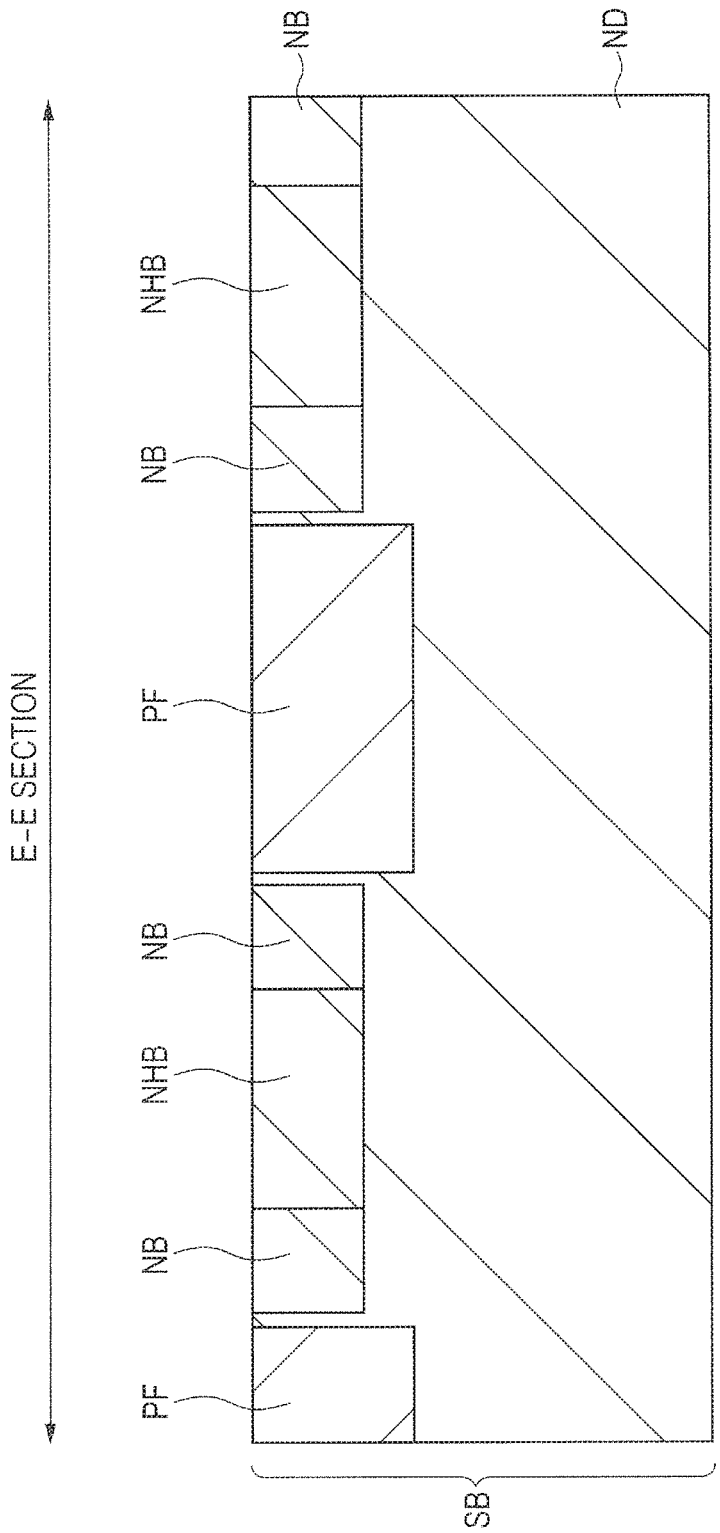
FIG. 9 is a sectional view illustrating the manufacturing process of the semiconductor device of the first embodiment.

FIGS. 8 and 9 show formation steps of the drift region ND, the isolation region NB, the hole barrier region NHB, and the floating region PF.

First, the n-type drift region ND is formed in the semiconductor substrate SB. The n-type drift region ND is formed by providing the semiconductor substrate SB containing a beforehand introduced n-type impurity, and using the n-type semiconductor substrate SB as the drift region ND, or formed through an epitaxial process on a p-type semiconductor substrate SB that is beforehand provided. In the description of the first embodiment, the drift region ND may be referred to as the semiconductor substrate SB.

Subsequently, a photolithography process and an ion implantation process are used to form the n-type isolation region NB, the n-type hole barrier region NHB, and the p-type floating region PF in the surface of the semiconductor substrate SB. The hole barrier region NHB has a higher impurity concentration than that of the drift region ND. The n-type isolation region NB has an impurity concentration equal to or higher than that of the hole barrier region NHB.

Although the first embodiment is described assuming that the n-type isolation region NB and the hole barrier region NHB are different impurity regions, if the hole barrier region NHB has a sufficiently high impurity concentration, the hole barrier region NHB may be used for the n-type isolation region NB while formation of the isolation region NB is omitted. That is, the isolation region NB may be formed by expanding the hole barrier region NHB from within the hybrid cell region HBC to the active cell region AC excluding the hybrid cell region HBC. This makes it possible to simplify the manufacturing process.

Figure 10:
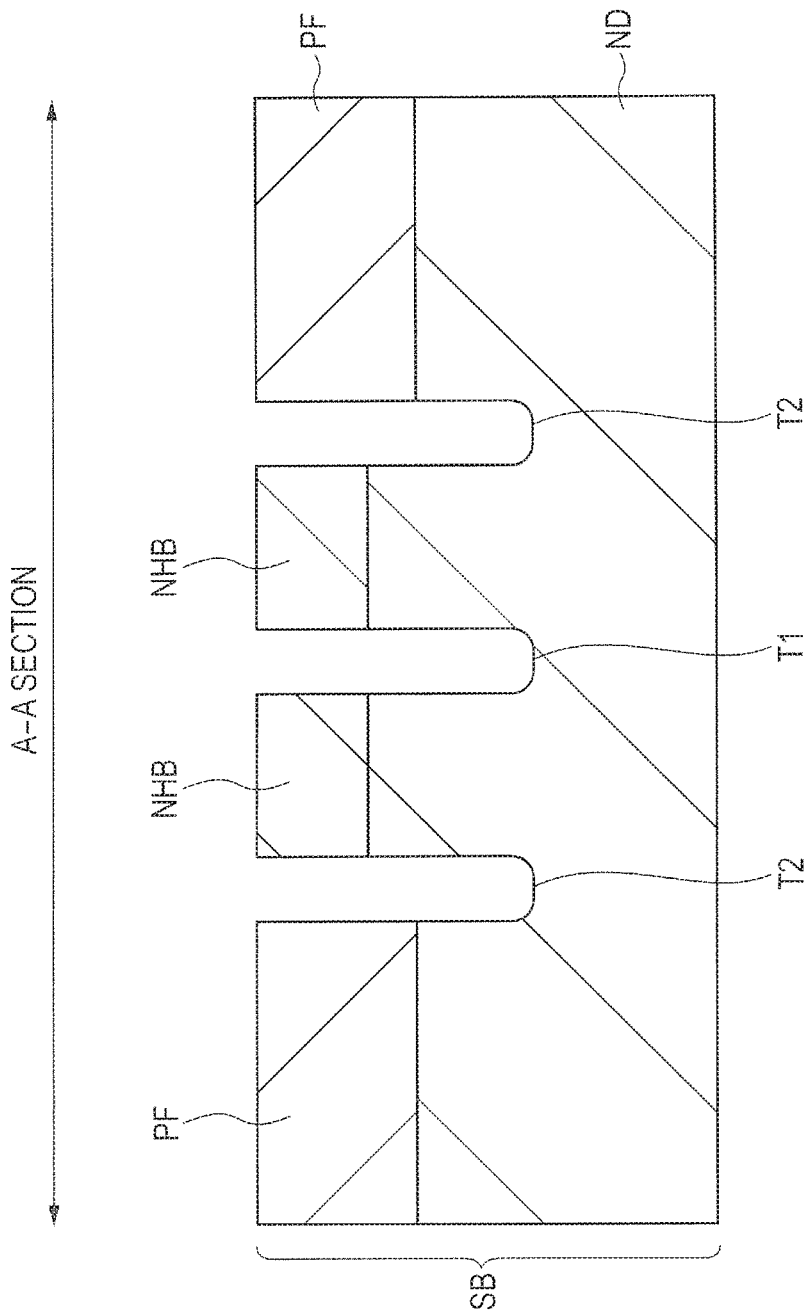
FIG. 10 is a sectional view illustrating the manufacturing process of the semiconductor device of the first embodiment.

FIG. 10 shows a formation step of the trenches T1 and T2.

First, an insulating film including, for example, a silicon oxide film is formed on the semiconductor substrate SB, and the insulating film is patterned using a photolithography process and dry etching to form a hard mask. Subsequently, the semiconductor substrate SB is etched with the hard mask as a mask to form the trenches T1 and T2 in the semiconductor substrate SB. Subsequently, the hard mask HM is removed.

As shown in FIG. 2, the trenches T1 and T2 are each continuously formed so as to extend in the Y direction in plan view.

Figure 11:
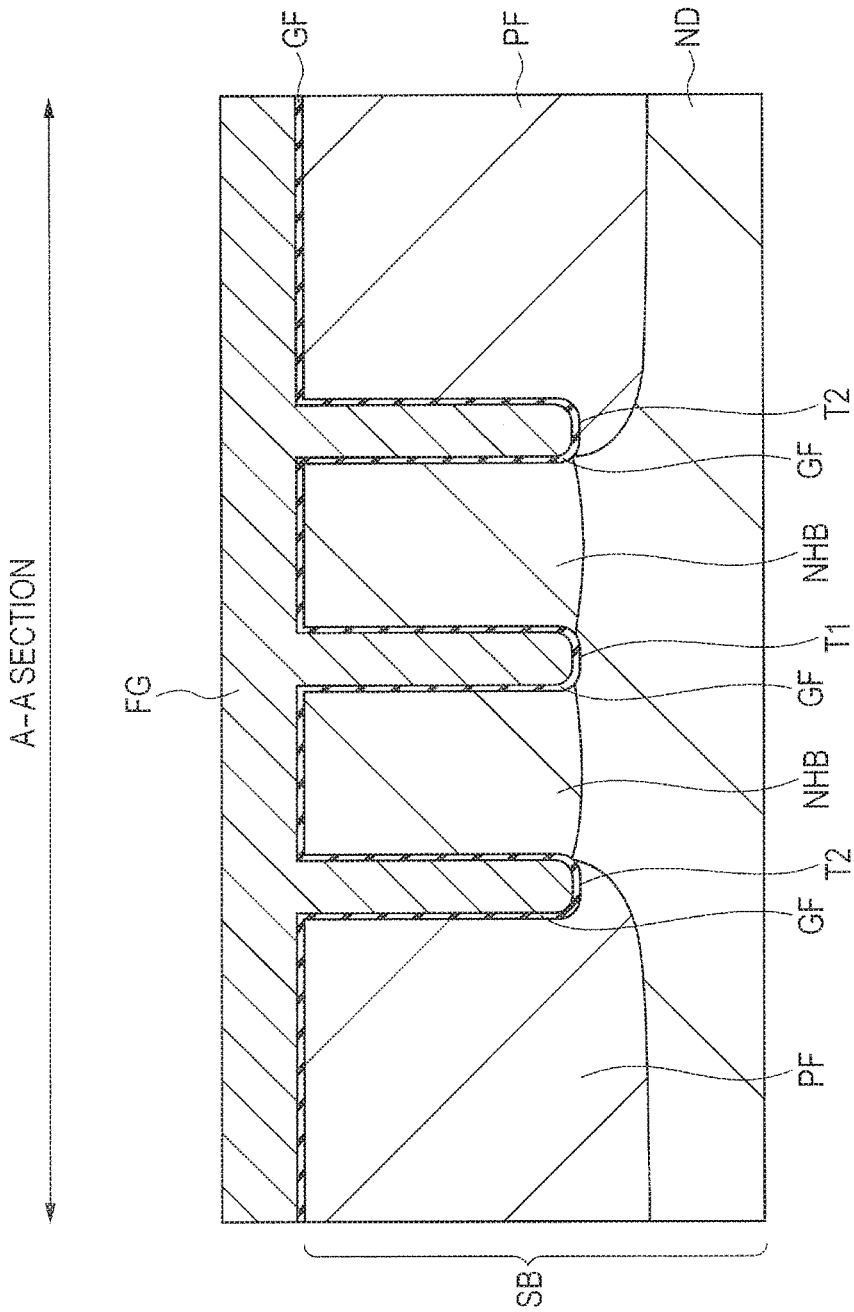
FIG. 11 is a sectional view illustrating the manufacturing process of the semiconductor device of the first embodiment.

FIG. 11 shows a heat treatment step and formation steps of the gate insulating film GF and a conductive film FG.

First, the semiconductor substrate SB is subjected to heat treatment to diffuse an impurity contained in each of the isolation region NB, the hole barrier region NHB, and the floating region PF. Through the heat treatment, the isolation region NB and the hole barrier region NHB diffuse to the vicinity of the bottom of each of the trenches T1 and T2, and the floating region PF diffuses to a position deeper than the bottom of each of the trenches T1 and T2 so as to cover the bottom of each of the trenches T1 and T2.

Subsequently, the semiconductor substrate SB is subjected to a thermal oxidation process to form the gate insulating film GF including, for example, a silicon oxide film on each of inner walls of the trenches T1 and T2, on the upper surface of the isolation region NB, on the upper surface of the hole barrier region NHB, and on the upper surface of the floating region PF.

Subsequently, the conductive film FG including a polycrystalline film containing, for example, an n-type impurity introduced therein is formed on the gate insulating film GF by, for example, a chemical vapor deposition (CVD) process so as to fill the inside of each of the trenches T1 and T2.

Figure 12:
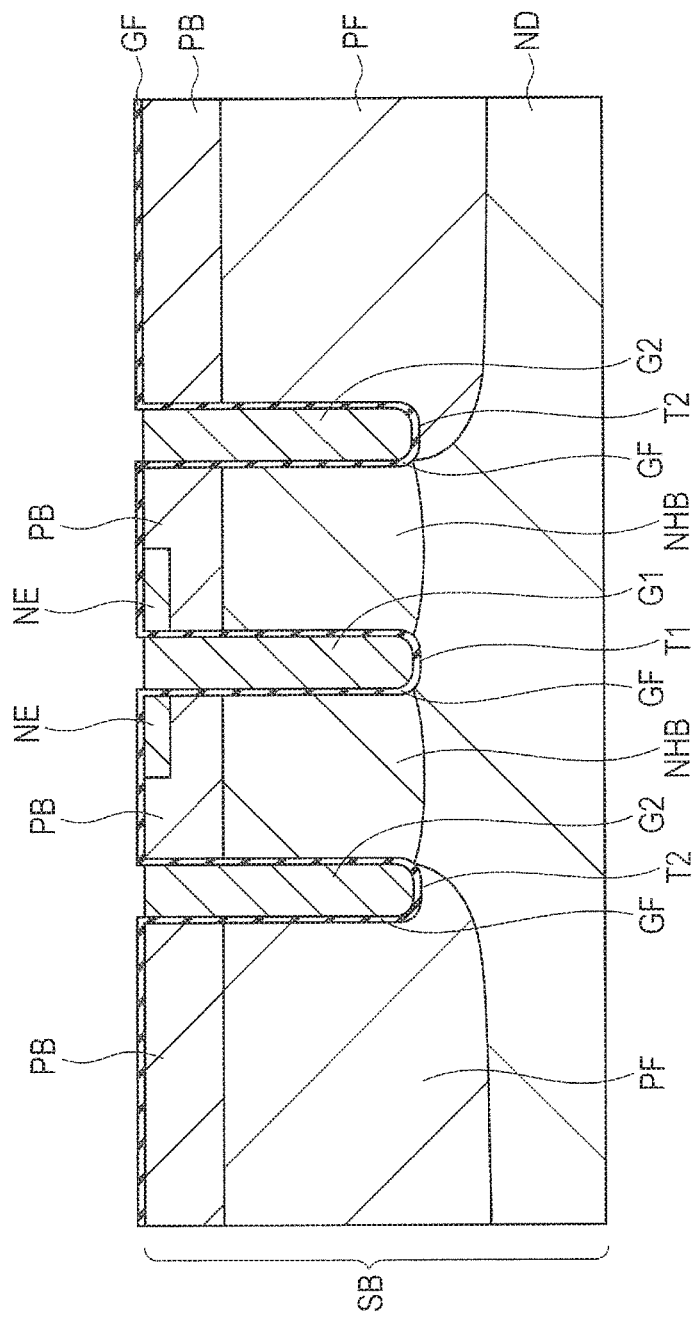
FIG. 12 is a sectional view illustrating the manufacturing process of the semiconductor device of the first embodiment.
Figure 13:
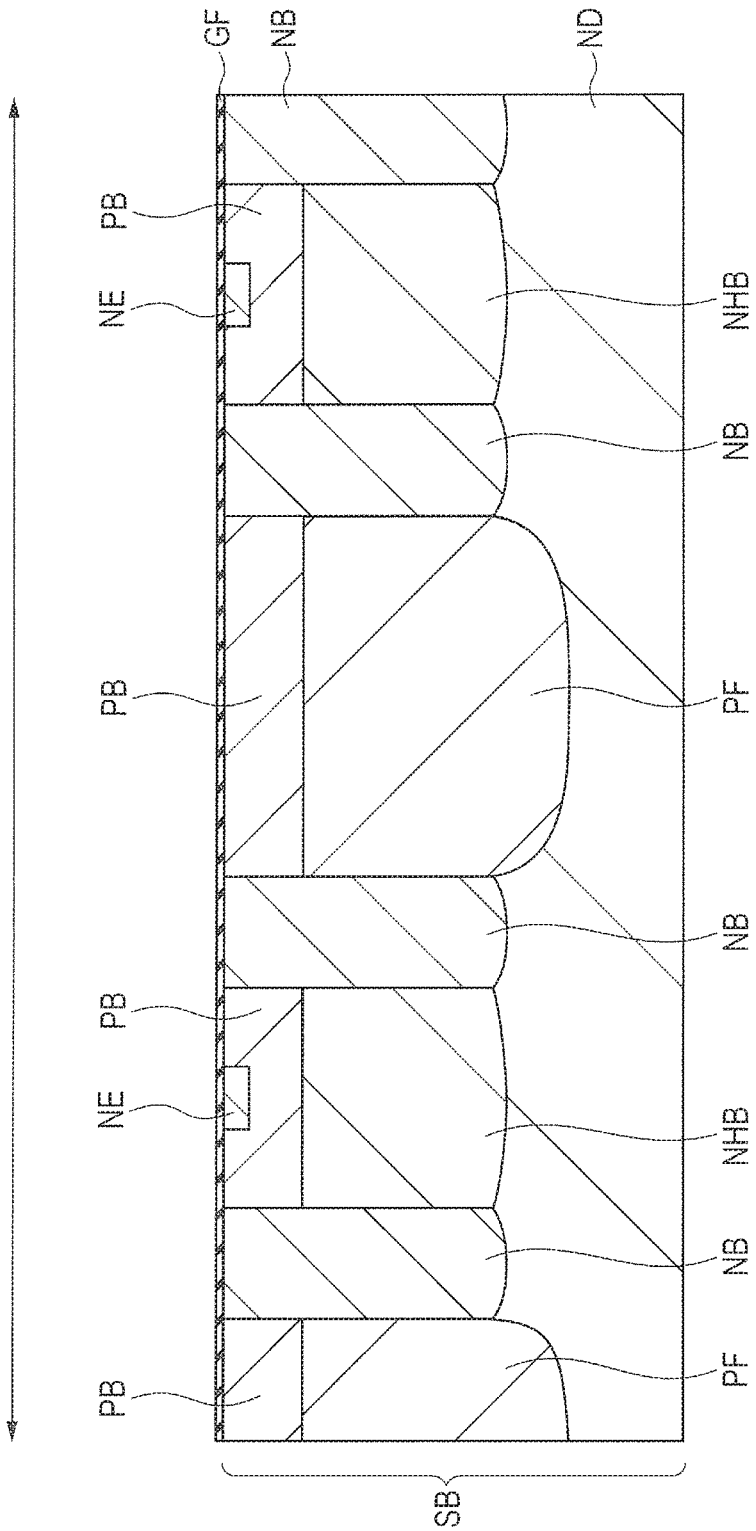
FIG. 13 is a sectional view illustrating the manufacturing process of the semiconductor device of the first embodiment.

FIGS. 12 and 13 show formation steps of the gate electrode G1, the gate electrode G2, the base region PB, and the emitter region NE.

First, the conductive film FG is processed using a photolithography process and dry etching to remove the conductive film FG formed outside the trenches T1 and T2. The conductive films FG left in the insides of the trenches T1 and T2 form the gate electrode G1 and the gate electrode G2, respectively.

Subsequently, a photolithography process and an ion implantation process are used to form the p-type base region PB in the surface of each of the floating region PF and the hole barrier region NHB. The base region PB is an impurity region having a higher impurity concentration than the floating region PF.

Subsequently, a photolithography process and an ion implantation process are used to form the n-type emitter region NE in the surface of the base region PB in the hybrid cell region HBC. The emitter region NE is an impurity region having a higher impurity concentration than each of the drift region ND and the hole barrier region NHB. No emitter region NE is formed in the base region PB in the inactive cell region IAC.

Figure 14:
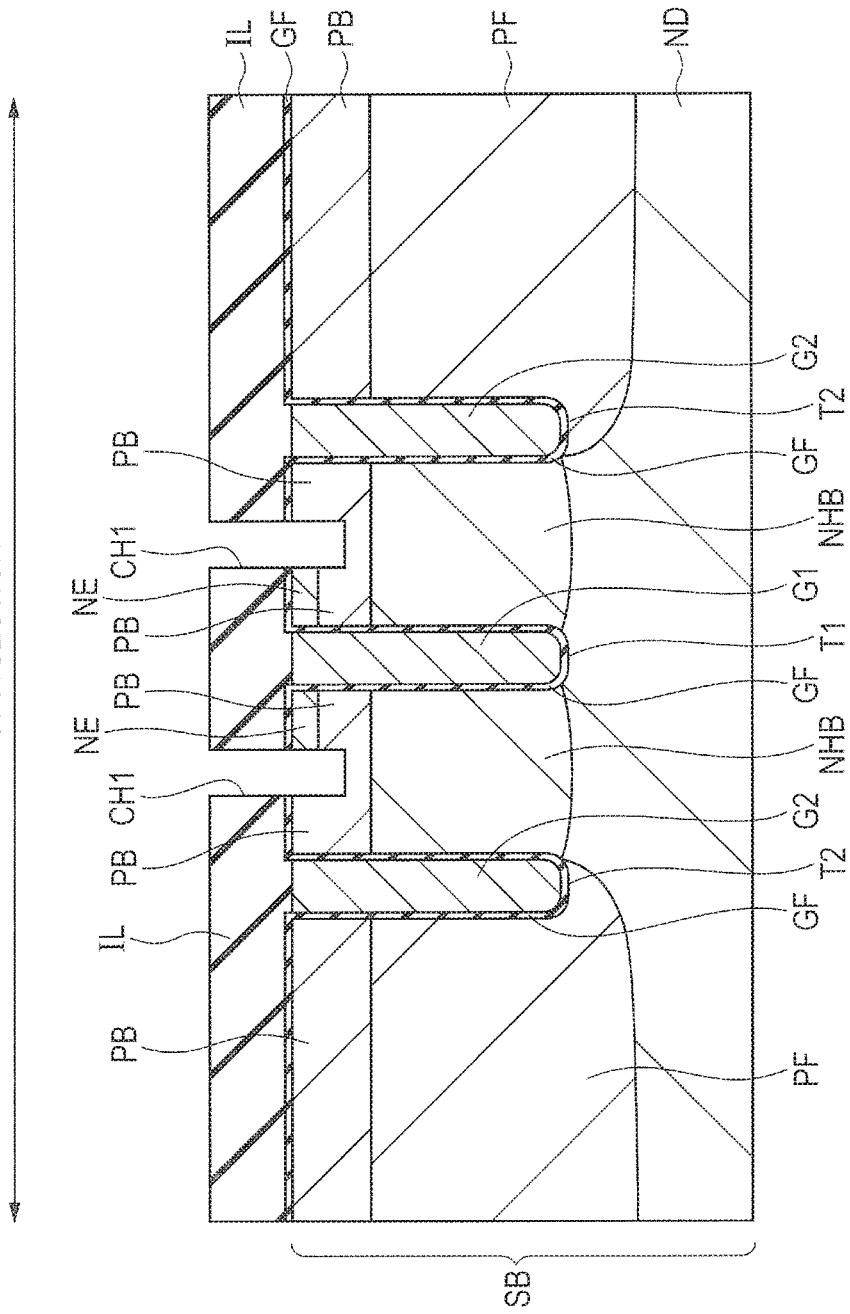
FIG. 14 is a sectional view illustrating the manufacturing process of the semiconductor device of the first embodiment.

FIG. 14 shows formation steps of the interlayer insulating film IL and the contact hole CH1.

First, the interlayer insulating film IL including, for example, a silicon oxide film is formed using, for example, a CVD process on the gate electrode G1, on the gate electrode G2, and on the gate insulating film GF formed outside the trenches T1 and T2.

Subsequently, a photolithography process and dry etching are used to form the contact hole CH1 through the interlayer insulating film IL and the gate insulating film GF in the active cell region AC. The bottom of the contact hole CH1 is configured to reach the base region PB through part of the semiconductor substrate SB. That is, the contact hole CH1 is formed so as to be in contact with the emitter region NE and the base region PB in the hybrid cell region HBC.

Figure 15:
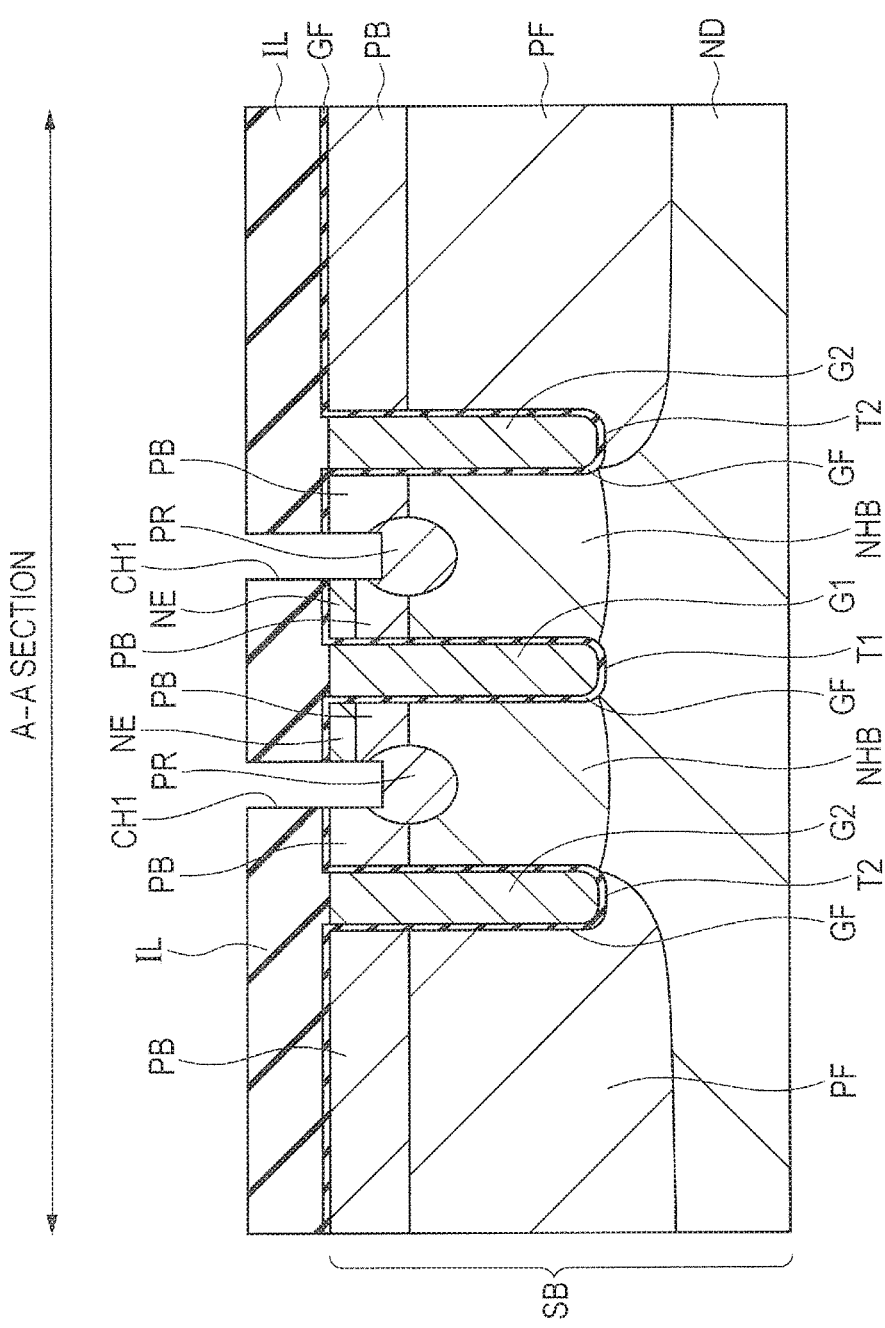
FIG. 15 is a sectional view illustrating the manufacturing process of the semiconductor device of the first embodiment.
Figure 16:
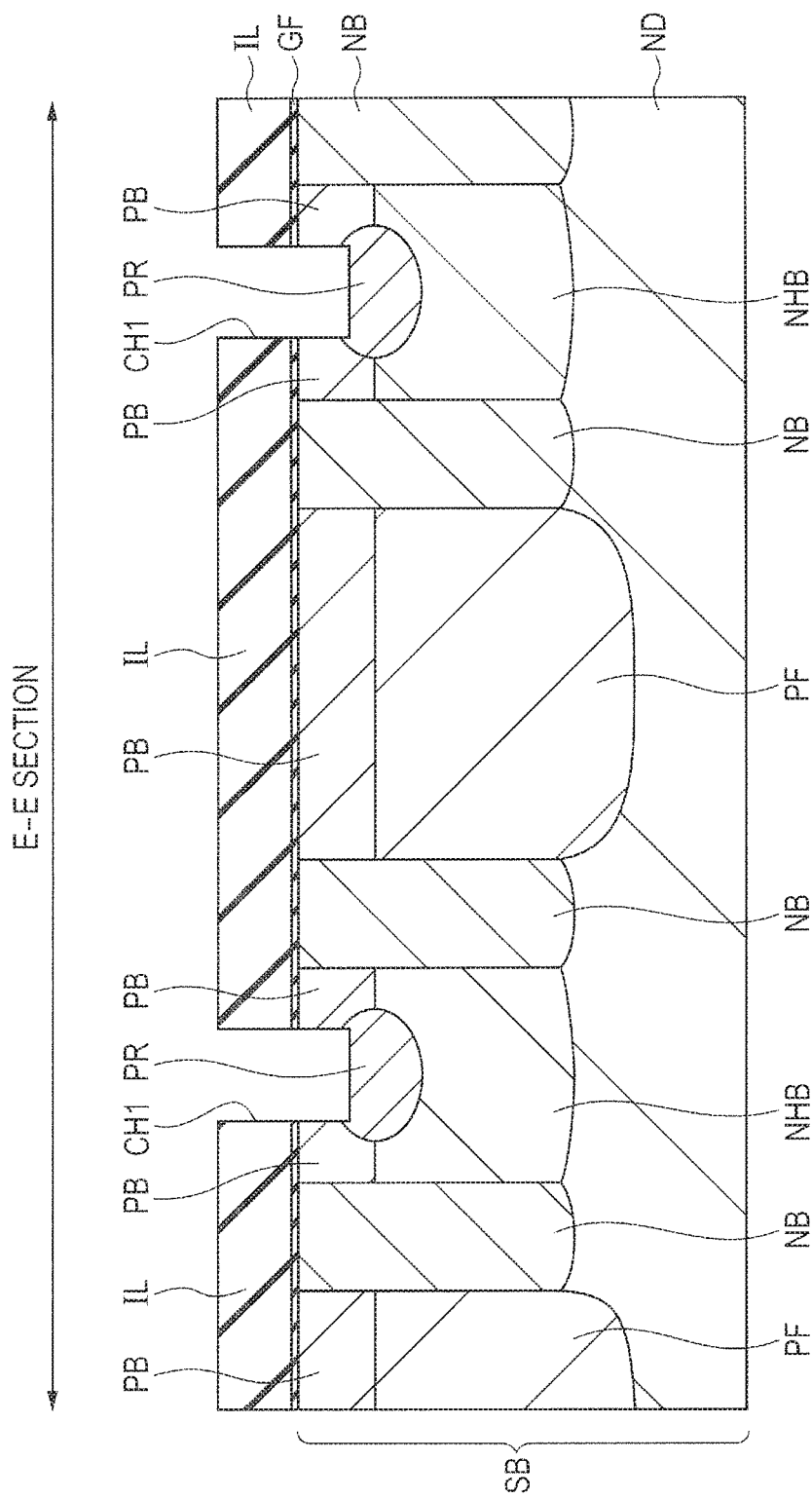
FIG. 16 is a sectional view illustrating the manufacturing process of the semiconductor device of the first embodiment.

FIGS. 15 and 16 show a formation step of the body region PR.

Following the formation step of the contact hole CH1, an ion implantation process is used to form the p-type body region PR at the bottom of the contact hole CH1. Each body region PR is an impurity region having a higher impurity concentration than the base region PB, and is formed so as to stride the base region PB and the hole barrier region NHB. The body region PR is formed so as not to be in contact with the n-type emitter region NE. Subsequently, heat treatment is performed to activate the impurity regions.

Figure 17:
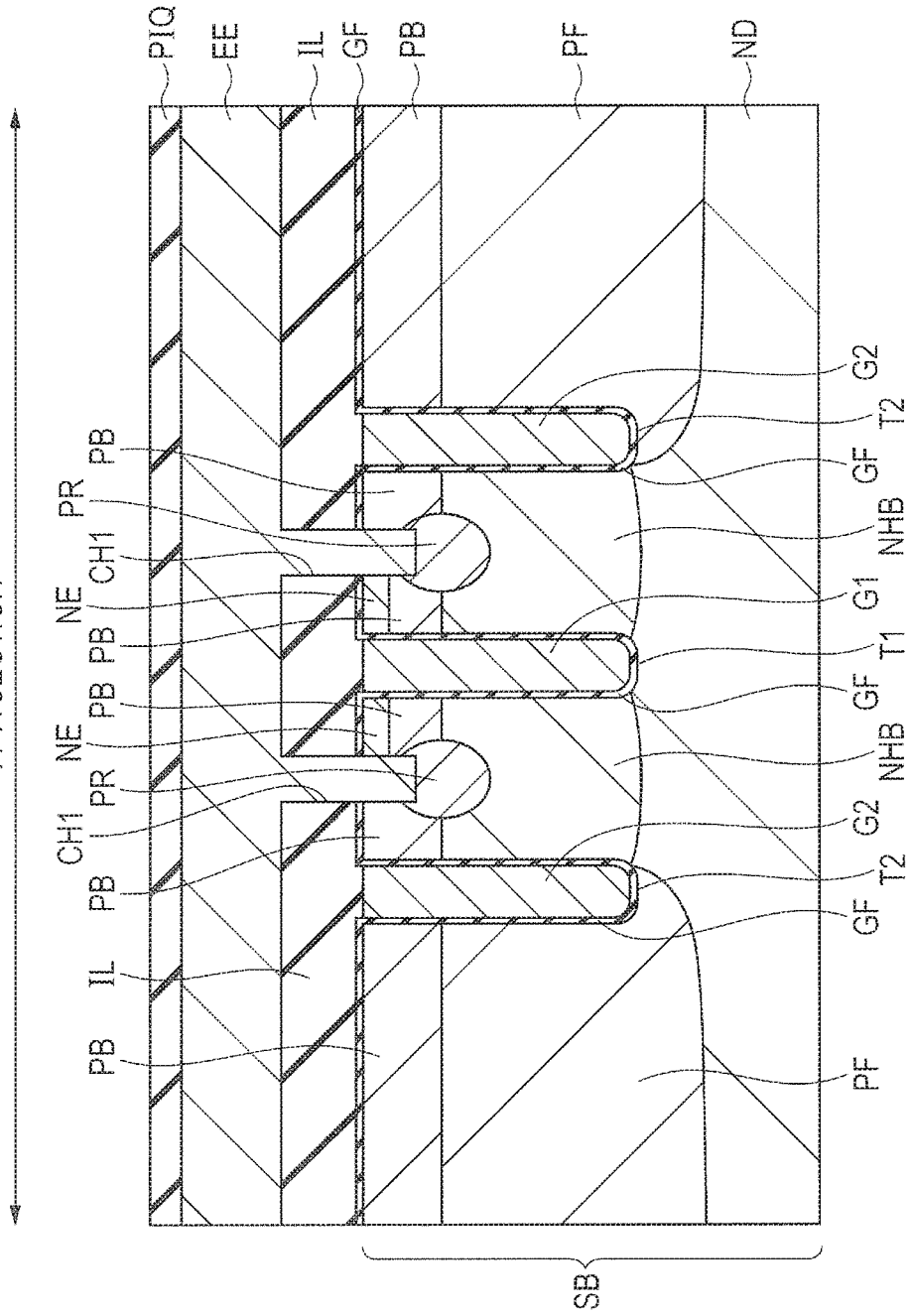
FIG. 17 is a sectional view illustrating the manufacturing process of the semiconductor device of the first embodiment.

FIG. 17 shows formation steps of the emitter potential electrode EE and the protective film PIQ.

First, for example, an aluminum film is formed using, for example, a sputtering process on the interlayer insulating film IL so as to fill the contact hole CH1. Subsequently, a photolithography process and dry etching are used to pattern the aluminum film, thereby the emitter potential electrode EE is formed. The gate potential electrode GE shown in FIG. 1 is also formed by patterning the aluminum film.

A barrier metal film including, for example, a titanium nitride film may be formed before formation of the aluminum film to form the aluminum film on the barrier metal film. That is, the emitter potential electrode EE and the gate potential electrode GE may each be formed as a stacked film of the barrier metal film and the aluminum film. In the first embodiment, the barrier metal film is not illustrated.

Subsequently, the protective film PIQ made of, for example, a resin such as polyimide is formed using, for example, a coating process so as to cover the emitter potential electrode EE and the gate potential electrode GE. Subsequently, a photolithography process and dry etching are used to form openings in part of the protective film PIQ, and thus part of the emitter potential electrode EE and part of the gate potential electrode GE are exposed from the openings. Such exposed regions form the emitter pad EP and the gate pad GP shown in FIG. 1.

After the steps of FIG. 17, a field stop region NS, the collector region PC, and the collector potential electrode CE are formed on the back side of the semiconductor substrate SB.

First, the back of the semiconductor substrate SB is subjected to polishing treatment to reduce the thickness of the semiconductor substrate SB. Subsequently, ion implantation is performed from the back side of the semiconductor substrate SB. The ion implantation is performed using a photolithography process and dry etching, so that the n-type field stop region NS and the p-type collector region PC are formed. The field stop region NS is an impurity region having a higher impurity concentration than the drift region ND.

Subsequently, the collector potential electrode CE including, for example, a metal film such as a titanium nitride film is formed in the surface of the collector region PC exposed on the back side of the semiconductor substrate SB by using a sputtering process or a CVD process, for example.

In this way, the semiconductor device of the first embodiment shown in FIGS. 3 to 7 is manufactured.

Description of First Examination Example

A semiconductor device of a first examination example examined by the inventors of this application is described below with reference to FIGS. 38 to 42.

Figure 38:
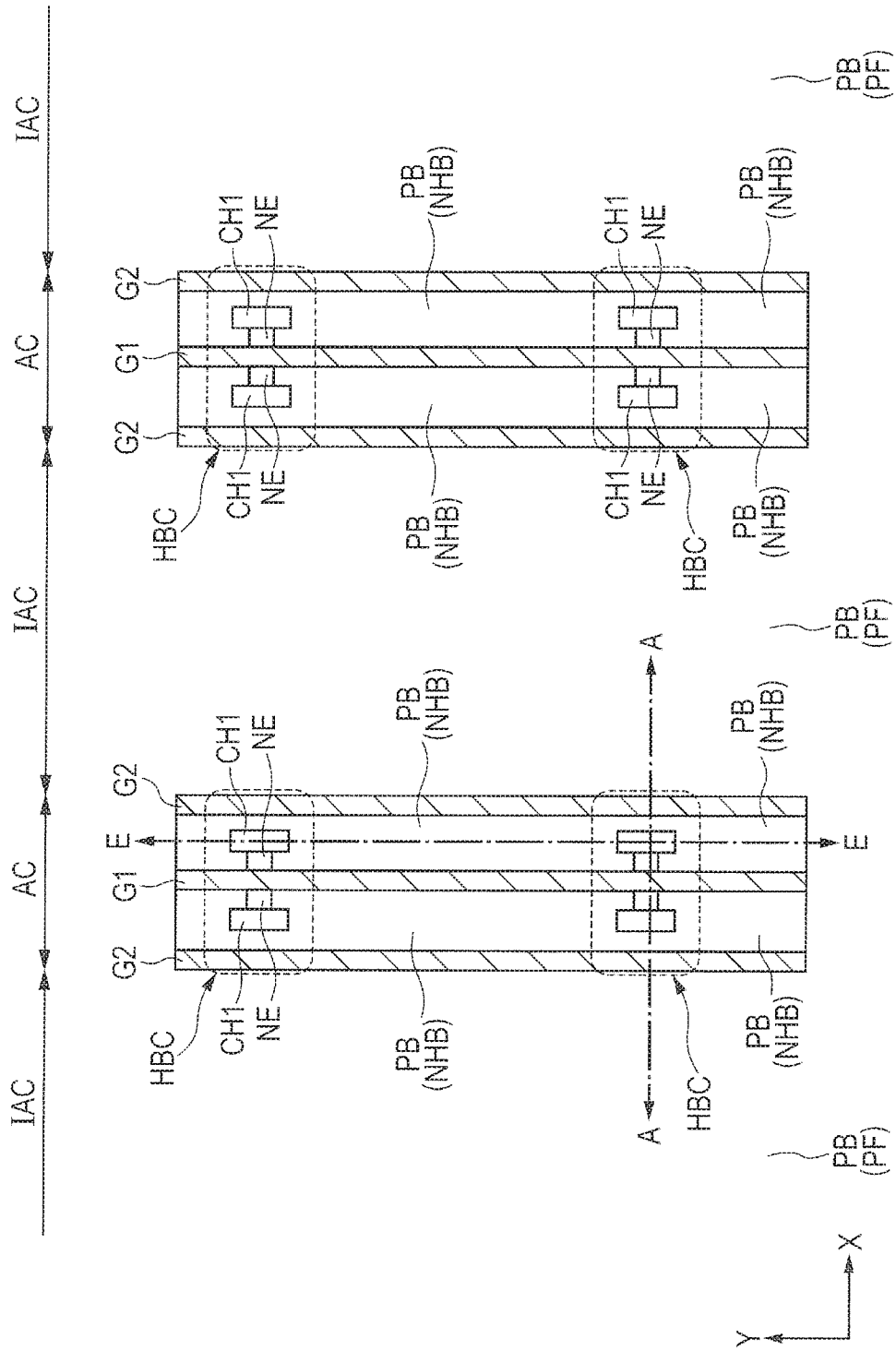
FIG. 38 is a major-part plan view of a semiconductor device of a first examination example.

FIG. 38 is a plan view of the semiconductor device of the first examination example, which corresponds to FIG. 2 in the first embodiment. The semiconductor device of the first examination example includes an IE IGBT having the EGE structure. See Japanese Unexamined Patent Application Publication No. 2016-184622 for a detailed description of a problem of generation of a displacement current toward the gate electrode due to a potential variation in the floating region PF in each of the GG structure and the EGE structure.

In the first examination example, unlike the first embodiment, the p-type base region PB is continuously formed in the surface of the n-type hole barrier region NHB so as to be in contact with a plurality of hybrid cell regions HBC in the Y direction in the active cell region AC. That is, the isolation region NB in the first embodiment is not formed in the first examination example.

Figure 39:
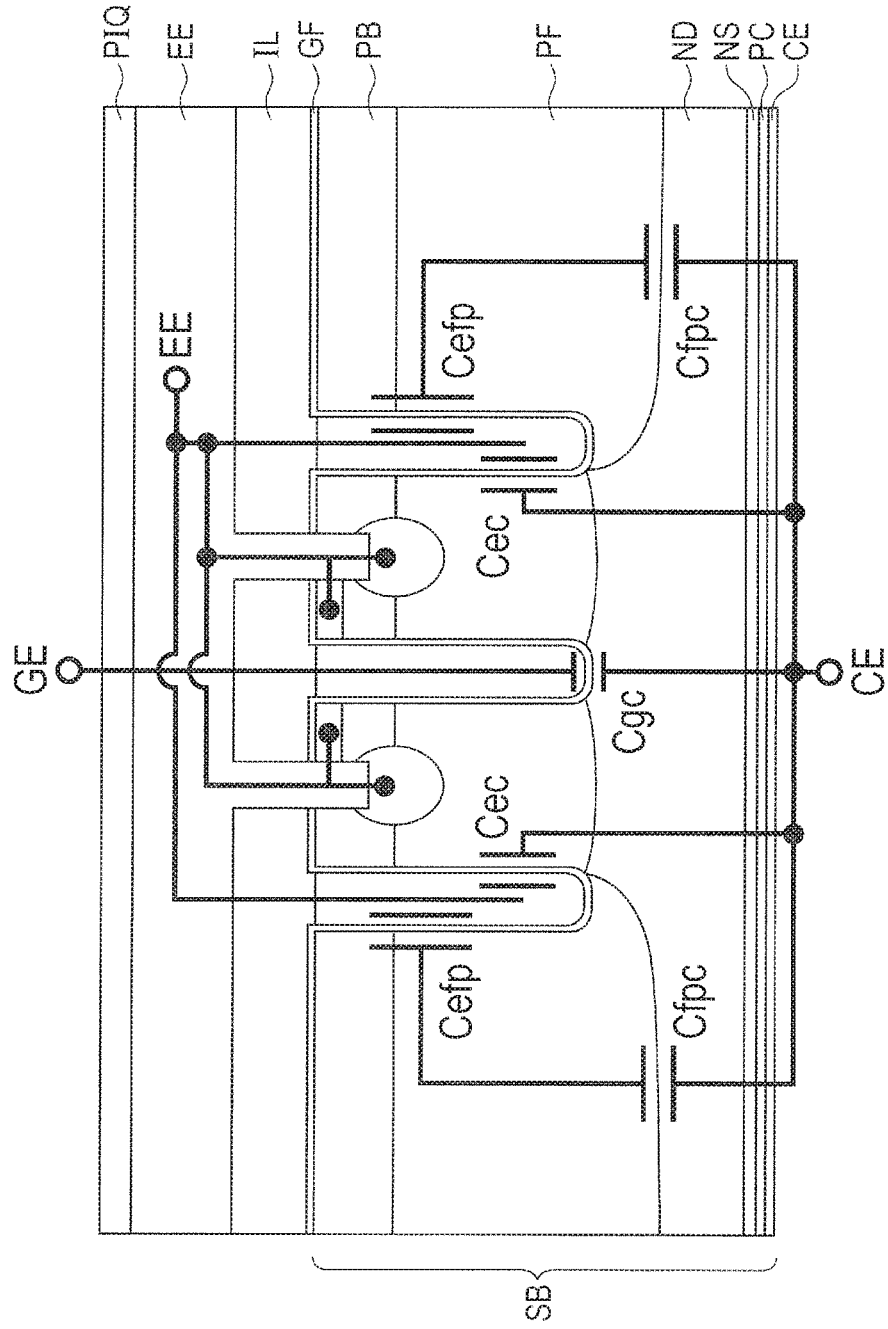
FIG. 39 is an explanatory diagram to show part of a capacitance component during operation of an IBGT of the first examination example.
Figure 40:
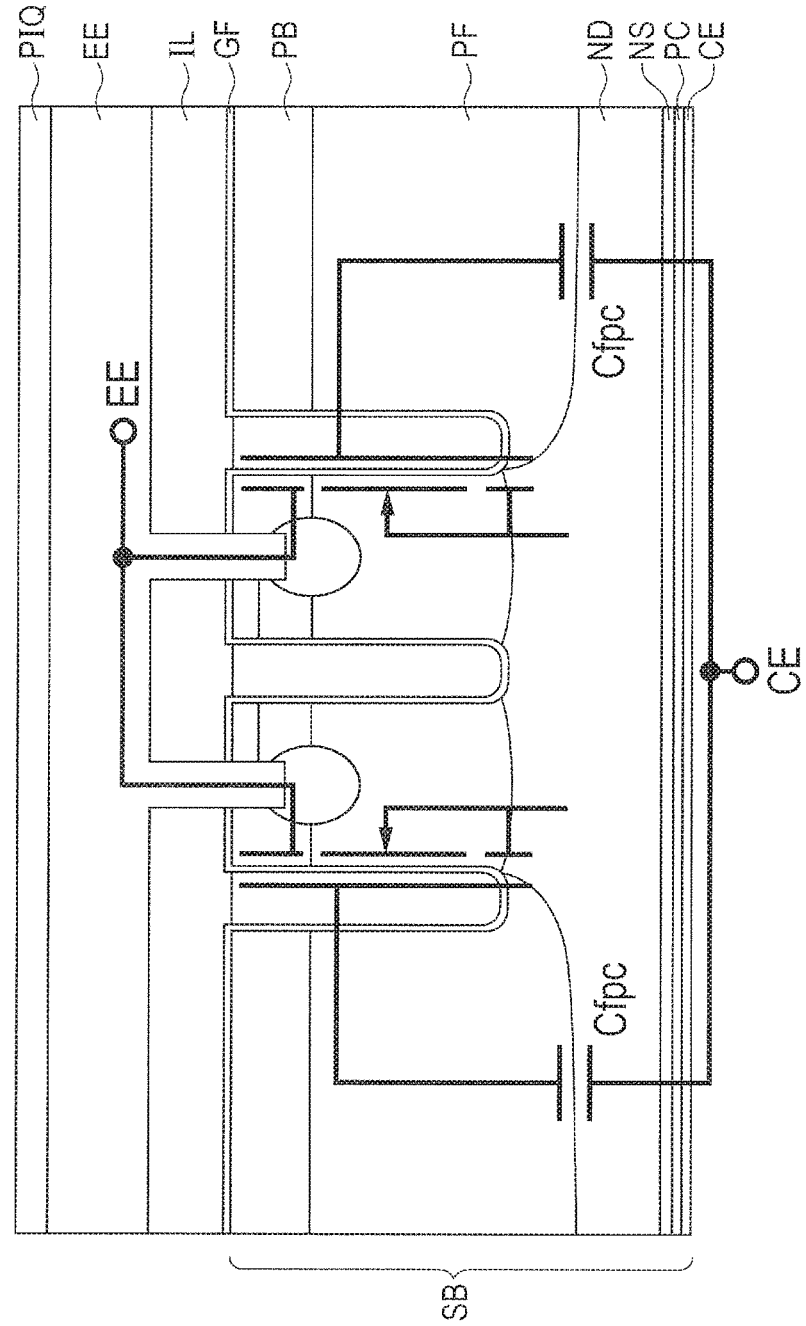
FIG. 40 is an explanatory diagram to show a parasitic p-type MOSFET during operation of the IBGT of the first examination example.
Figure 41:
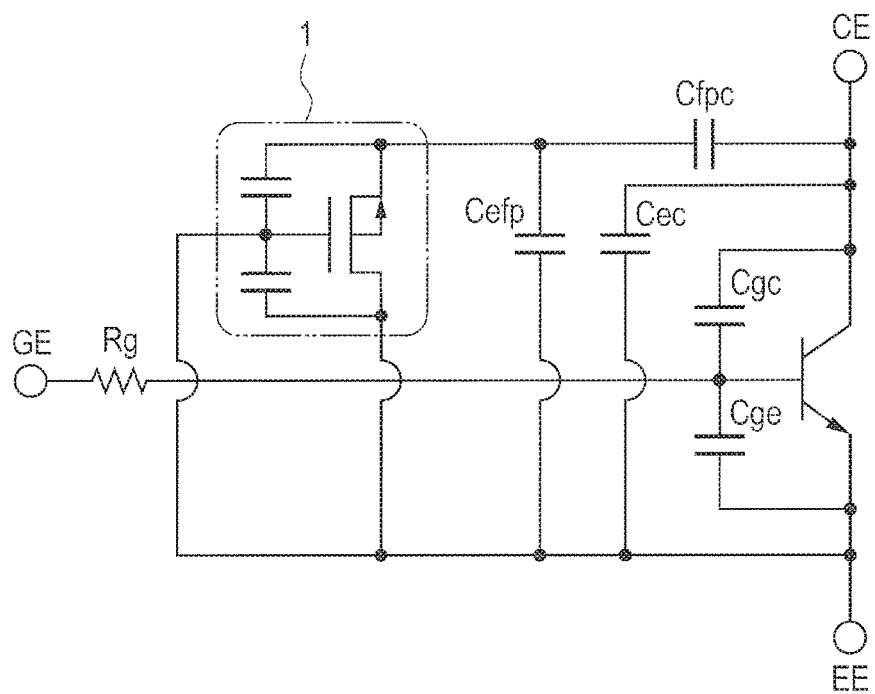
FIG. 41 is an equivalent circuit diagram of the entire IGBT shown in FIGS. 39 and 40.
Figure 42:
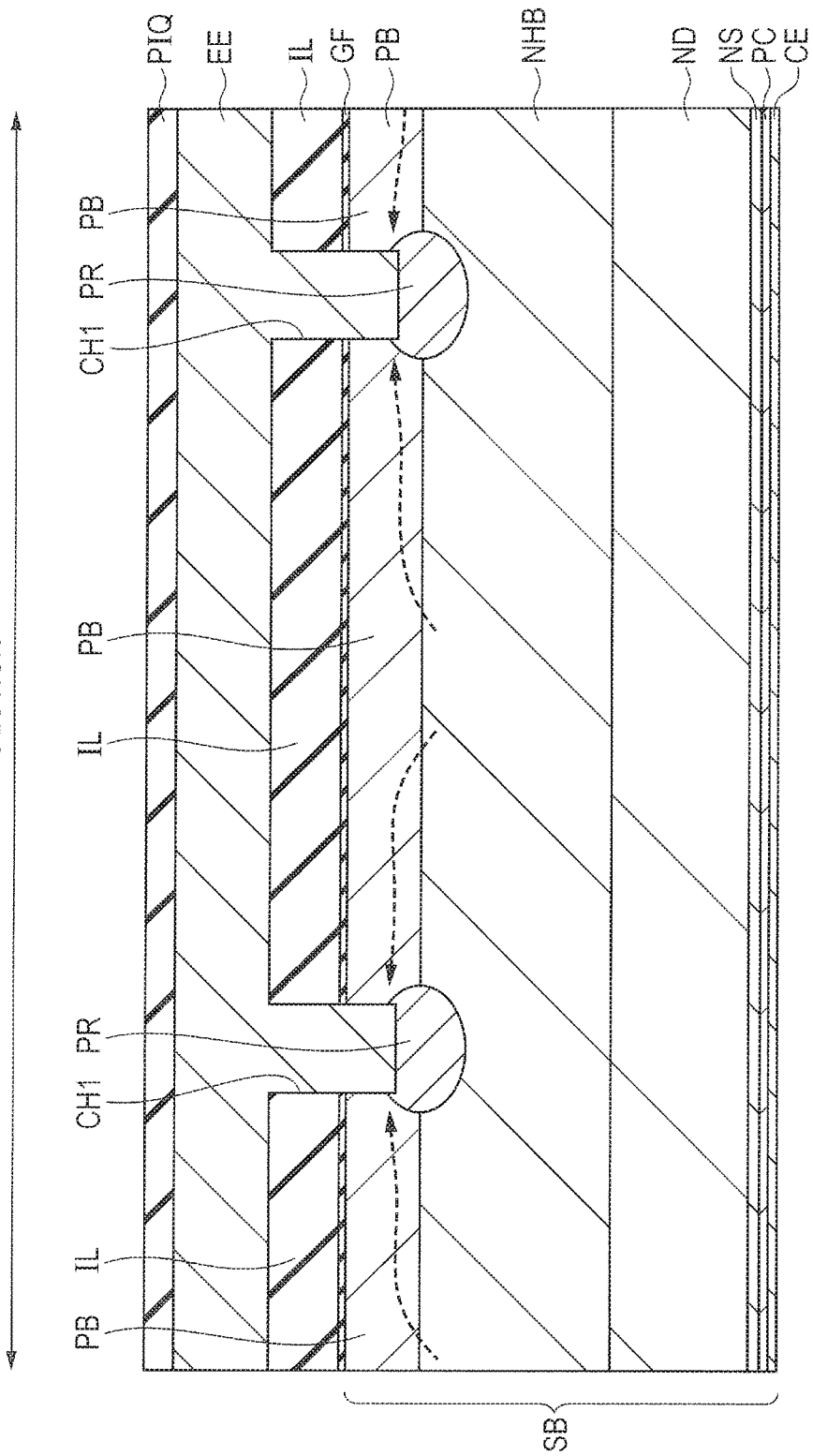
FIG. 42 is a sectional view of the semiconductor device of the first examination example.

Issues of the first examination example are described below with reference to FIGS. 39 to 42. FIG. 39 is an explanatory diagram to show a capacitance component during operation of an IBGT. FIG. 40 is an explanatory diagram to show a parasitic p-type MOSFET1 during operation of the IBGT. Although FIGS. 39 and 40 are each a sectional view along a line A-A in FIG. 38, hatching and some of reference numerals are omitted for clear description. The sectional view along the line A-A in FIG. 38 is similar to FIG. 3 in the first embodiment. Hence, see FIG. 3 for a detailed sectional structure. FIG. 41 is an equivalent circuit diagram of the entire IGBT shown in FIGS. 39 and 40. FIG. 42 is a sectional view along a line E-E in FIG. 38.

As shown in FIGS. 39 to 41, the IE IGBT having the EGE structure of the first examination example can be represented by an equivalent circuit having the collector potential electrode CE, the emitter potential electrode EE, the gate potential electrode GE, capacitances Cgc, Cge, Cec, Cfpc, and Cefp, and the parasitic p-type MOSFET1.

A displacement current toward the gate electrode G1 is generated with a variation in a collector voltage during operation of the IGBT shown in FIG. 39. A main path of the displacement current includes a path via the capacitance Cgc and a path via the capacitance Cfpc and Cefp. In the EGE structure, compared with the GG structure, a path via the floating region PF (path via the capacitances Cfpc and Cefp) can be shut off by the gate electrode G2 coupled to the emitter potential, and influence of the displacement current is small because of a small capacitance Cgc.

The parasitic p-type MOSFET1 shown in FIG. 40 is provided to suppress a potential variation caused by holes stored in the surface of the floating region PF. The parasitic p-type MOSFET1 operates through flow of a hole current along a current path from the n-type drift region ND via the p-type floating region PF and via regions, which are each in the vicinity of the bottom of the trench T2, of the p-type floating region PF, the n-type hole barrier region NHB, and the p-type base region PB. That is, the parasitic p-type MOSFET1 is configured of the gate electrode G2, as a gate, coupled to the emitter potential electrode EE, the p-type floating region PF as a source, the p-type base region PB as a drain, and the n-type hole barrier region NHB as a channel. This allows holes existing in the vicinity of the bottom of the trench T2 to be discharged as carriers at turn-on of the LGBT. Consequently, a potential variation in the floating region PF can be suppressed.

However, if an excessively large amount of holes are discharged, the IE effect is reduced, leading to an increase in switching loss at turn-on. It is therefore an issue of the first examination example to appropriately adjust hole discharge such that the IE effect is not excessively reduced.

As shown in FIG. 42, in the first examination example, the contact holes CH1, which are originally formed so as to continuously extend in the Y direction, are separately provided for the respective hybrid cell regions HBC. Consequently, holes tend to be concentrated in each body region PR as a high-concentration p-type impurity region, so that the hole discharge path is divided for each contact hole CH1. In this way, the first examination example prevents the IE effect from being reduced.

In the first examination example, however, holes may be discharged from each contact hole CH1 via the base region PB adjacent to the hybrid cell region HBC in the Y direction in the active cell region AC. Arrows in FIG. 42 indicate the hole discharge paths via the base region PB. Hence, the semiconductor device of the first examination example cannot sufficiently solve the problem of an increase in switching loss at turn-on due to a reduction in the IE effect.

Description of Second Examination Example

The inventors of this application have further examined that a structure where a region having an n-type emitter region is surrounded by a trench gate having a gate potential, so-called cutoff trench structure, is used in the IE IGBT having the GG structure as disclosed in Japanese Unexamined Patent Application Publication No. 2012-256839.

In the cutoff trench structure, since the base region PB can be completely isolated by the trench gate having the gate potential, the IE effect can be greatly improved. However, the cutoff trench structure increases gate capacitance, and thus disadvantageously causes a significant increase in switching loss.

Furthermore, it is difficult to apply the cutoff trench structure to the EGE structure as in the first embodiment. Specifically, in the EGE structure, since the gate electrode G1 having the gate potential and the gate electrode G2 having the emitter potential are disposed so as to be adjacent to each other in the X direction, the gate electrode G1 cannot be allowed to extend in the X direction to isolate the base region PB.

Main Features and Effects of Semiconductor Device of First Embodiment

The main features and effects of the semiconductor device of the first embodiment are described below.

First, as shown in FIG. 2, in the first embodiment, a plurality of hybrid cell regions HBC are separately provided in the Y direction instead of forming the hybrid cell region HBC over the entire area in the active cell region AC. In addition, a plurality of contact holes CH1 are provided for the respective hybrid cell regions HBC instead of forming the contact hole CH1 in the Y direction entirely in the active cell region AC. This reduces area of the parasitic p-type MOSFET1 formed in the active cell region AC compared with the case where the contact hole CH1 is formed in the Y direction entirely in the active cell region AC, which in turn reduces the discharge path of holes stored in the surface of the floating region PF. Consequently, the IE effect is improved; hence, switching loss is reduced at turn-on of the IGBT.

As shown in FIGS. 2 and 7, in the semiconductor device of the first embodiment, the isolation regions NB are formed in the active cell region AC unlike the semiconductor device of the first examination example. Specifically, while the base region PB and the floating region PF are formed in the region other than the hybrid cell region HBC in the Y direction, the base region PB, the floating region PF, and the hybrid cell region HBC are isolated from one another by the isolation region NB.

As described above, in the first embodiment, although the contact holes CH1 are provided for the respective hybrid cell regions HBC to reduce the hole discharge path, the base region PB between the respective hybrid cell regions HBC may serve as a hole path. The isolation region NB is provided to shut off the hole path. That is, while the hole discharge paths are shown by arrows in FIG. 7, the isolation region NB acts as a high-resistance region for holes, and thus hole discharge efficiency is drastically decreased. Consequently, the hole discharge path via the base region PB is substantially shut off by the isolation region NB. This further suppresses the hole discharge effect and thus improves the IE effect, so that switching loss is further reduced at turn-on of the IGBT. As described above, the first embodiment can improve performance of the semiconductor device.

In addition, the first embodiment is characterized in that the floating region PF is formed below the base region PB formed between the respective hybrid cell regions HBC in the active cell region AC. The floating region PF in the active cell region AC is formed at a position deeper than the trench T2 in which the gate electrode G2 is buried, and is coupled to the floating region PF in the inactive cell region IAC. Since the floating region PF in the active cell region AC is adjacent to the gate electrode G1 having the gate potential, and is thus greatly affected by a potential variation due to holes stored in the vicinity of the surface of the floating region PF in the active cell region AC during operation of the IGBT. The floating region PF in the active cell region AC is coupled to the floating region PF in the inactive cell region IAC, and thus holes to be stored are dispersed, making it possible to suppress a potential variation.

In this structure, the floating region PF covers the bottom of the trench T2, making it possible to reduce an electric field in the vicinity of the bottom of the trench T2. It is therefore possible to increase the withstand voltage of the IGBT.

Second Embodiment

A semiconductor device of a second embodiment is described below with reference to FIGS. 18 to 20.

Figure 18:
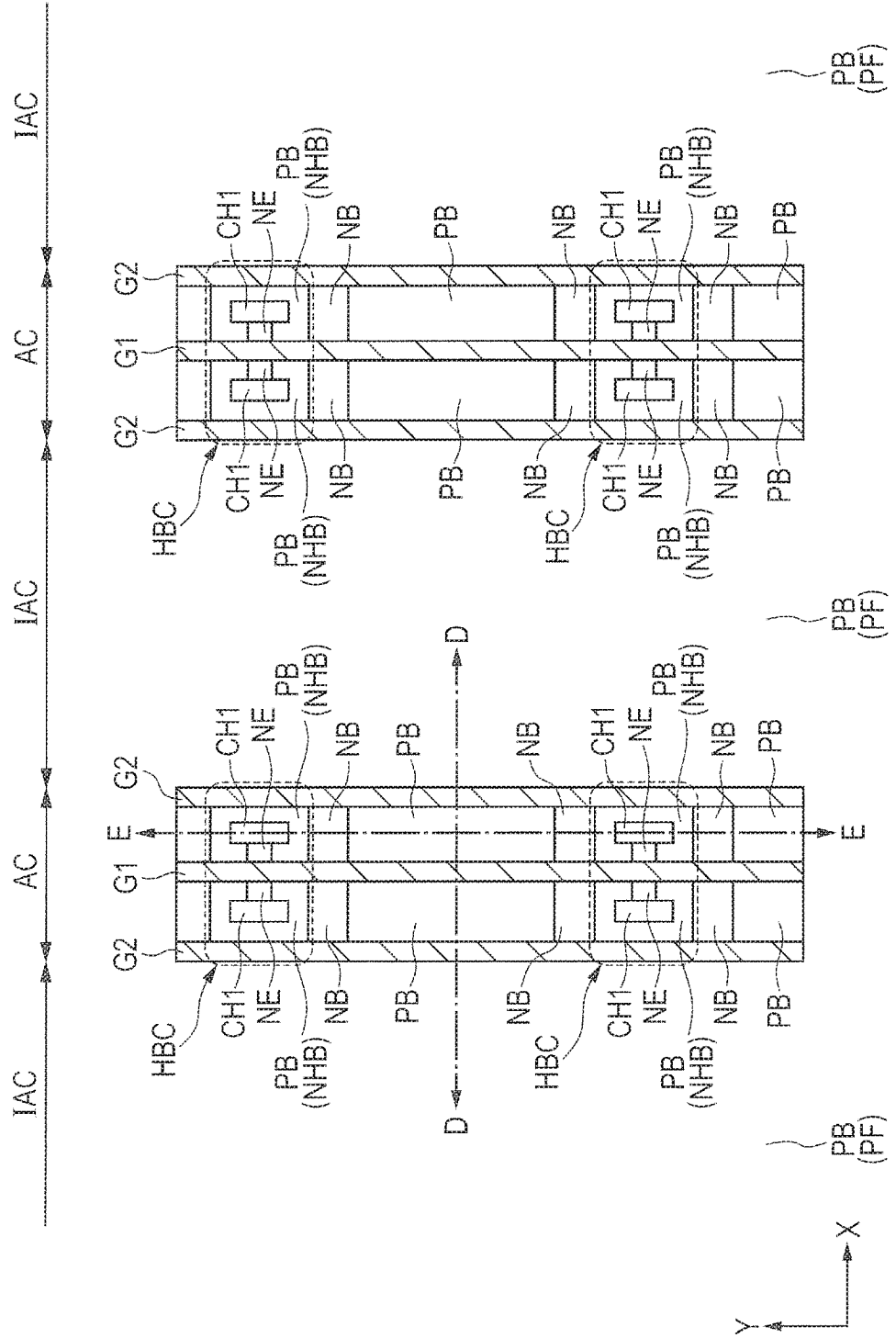
FIG. 18 is a major-part plan view of a semiconductor device of a second embodiment.

FIG. 18 is a major-part plan view of a semiconductor chip CHP, showing the same portion as FIG. 2 in the first embodiment. FIG. 19 is a sectional view along a line D-D in FIG. 18. FIG. 20 is a sectional view along a line E-E in FIG. 18. Since the sections along the lines A-A, B-B, and C-C in the first embodiment are similarly applied to the second embodiment, duplicated description is omitted.

In the first embodiment, the floating region PF is formed below the base region PB formed between the respective hybrid cell regions HBC in the active cell region AC. The base region PB in the active cell region AC is therefore coupled to the floating region PF in the inactive cell region IAC; hence, the hole discharge path occurs with operation of the parasitic p-type MOSFET1.

Figure 19:
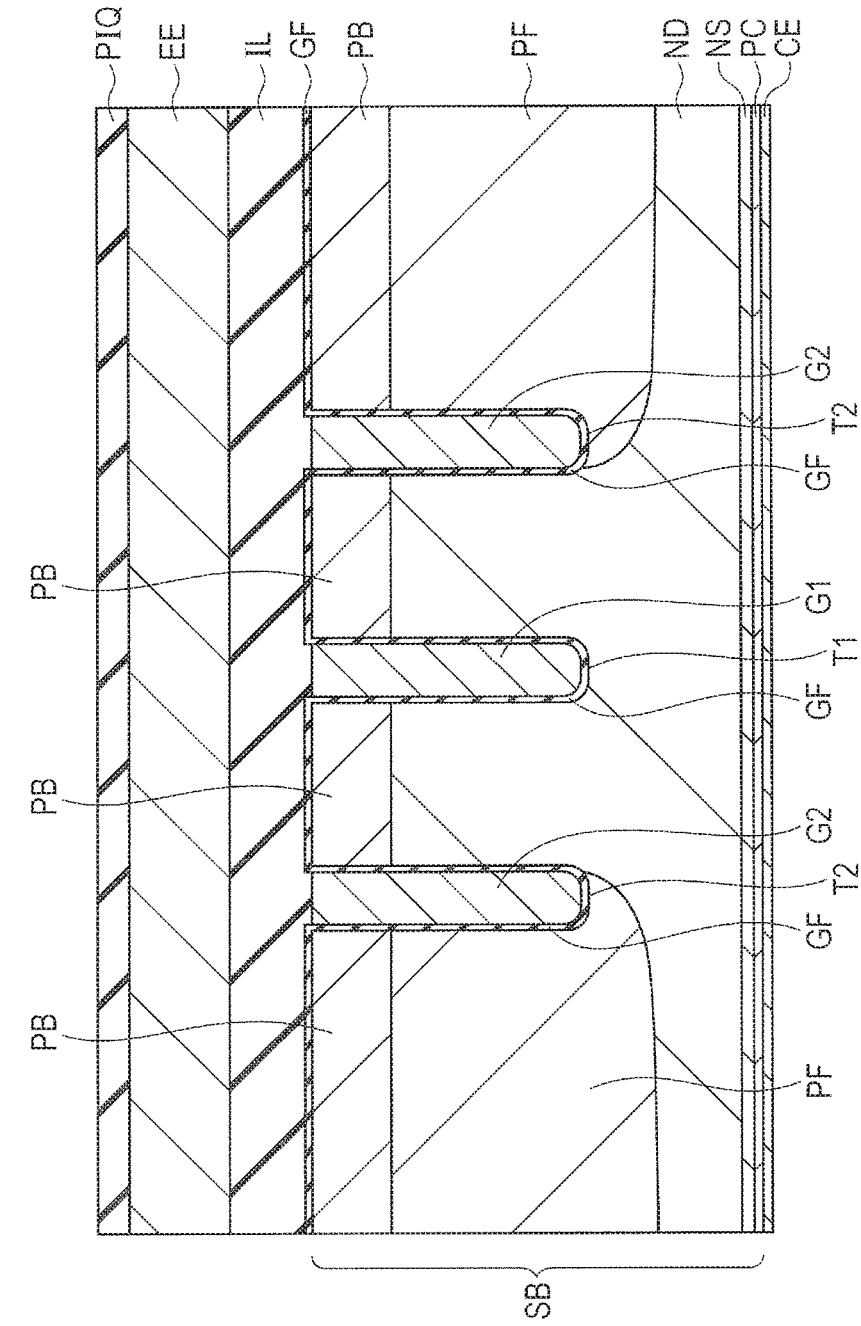
FIG. 19 is a sectional view of the semiconductor device of the second embodiment.
Figure 20:
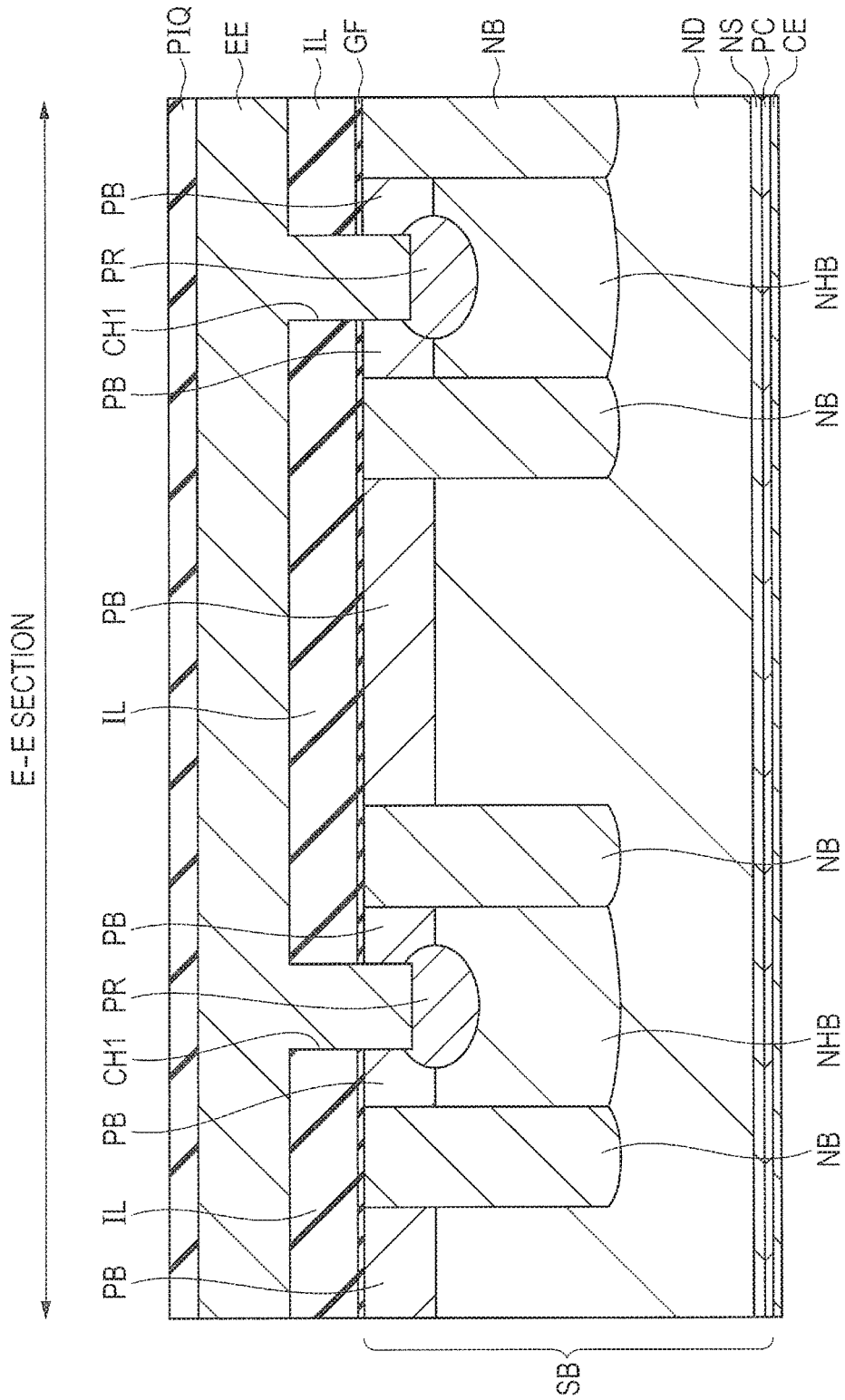
FIG. 20 is a sectional view of the semiconductor device of the second embodiment.

On the other hand, in the second embodiment, as shown in FIGS. 19 and 20, the floating region PF is not formed in the active cell region AC. That is, the floating region PF in the inactive cell region IAC is isolated from the base region PB in the active cell region AC.

The second embodiment therefore provides a small effect of reducing the electric field in the vicinity of the bottom of the trench T2 compared with the first embodiment.

In the second embodiment, however, the base region PB in the active cell region AC is isolated from the hole discharge path, which reduces a hole discharge effect, leading to an increase in the amount of hole storage. In the semiconductor device of the second embodiment, therefore, the IE effect is improved compared with in the semiconductor device of the first embodiment, and thus the switching loss at turn-on of the IGBT is further reduced.

Third Embodiment

A semiconductor device of a third embodiment is described below with reference to FIGS. 21 to 23.

Figure 21:
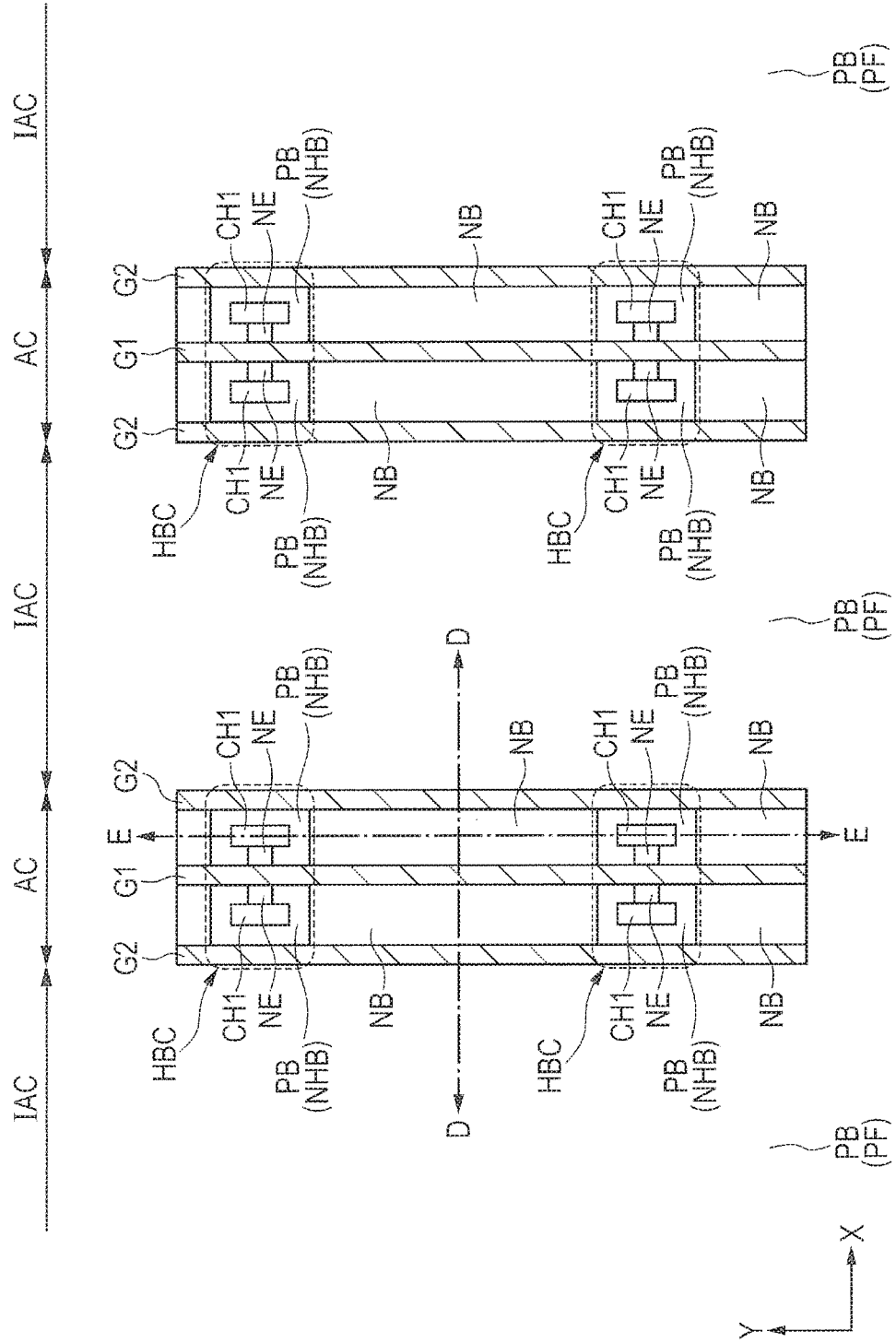
FIG. 21 is a major-part plan view of a semiconductor device of a third embodiment.

FIG. 21 is a major-part plan view of a semiconductor chip CHP, showing the same portion as FIG. 2 in the first embodiment. FIG. 22 is a sectional view along a line D-D in FIG. 21. FIG. 23 is a sectional view along a line E-E in FIG. 21.

In the first embodiment, the base region PB and the floating region PF are formed between the respective hybrid cell regions HBC in the active cell region AC.

Figure 22:
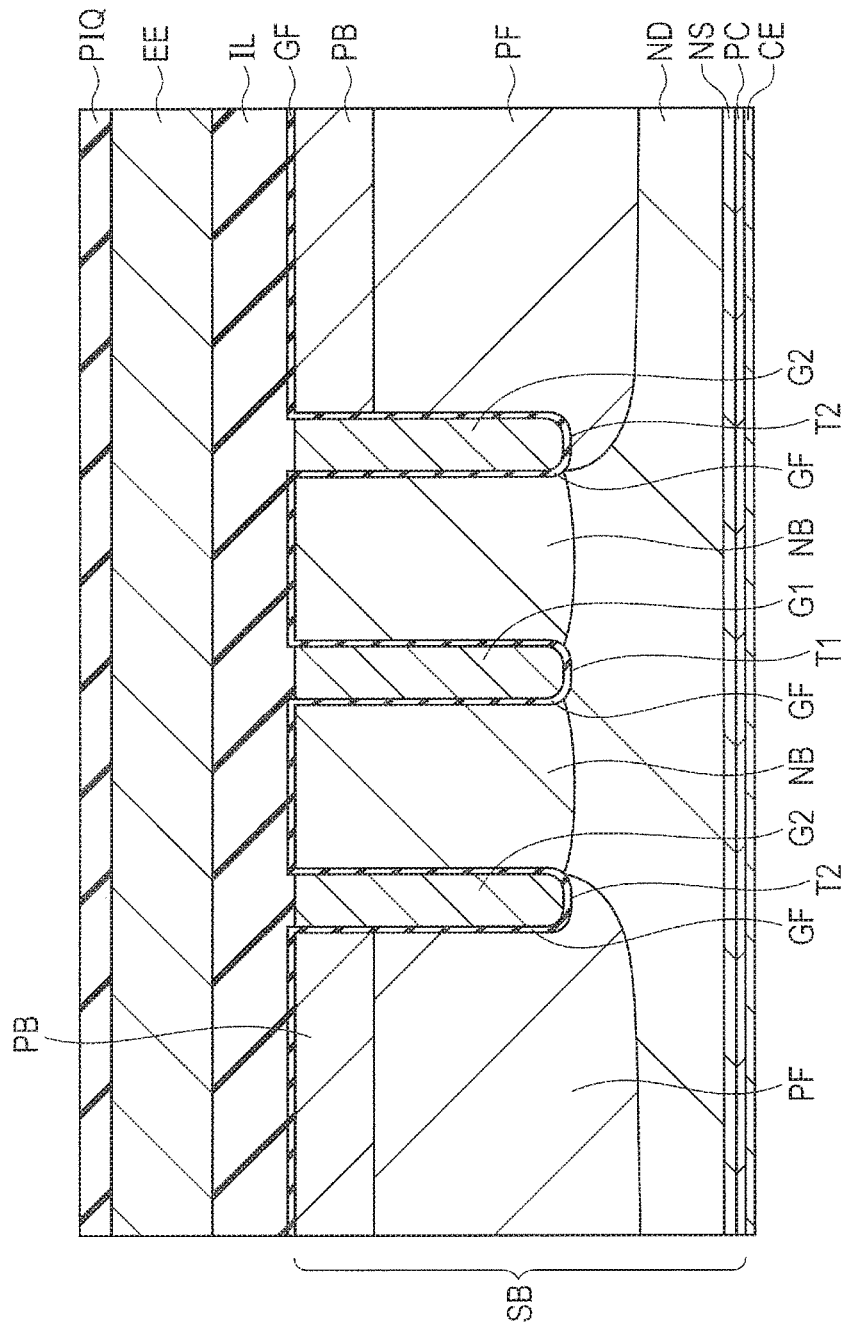
FIG. 22 is a sectional view of the semiconductor device of the third embodiment.
Figure 23:
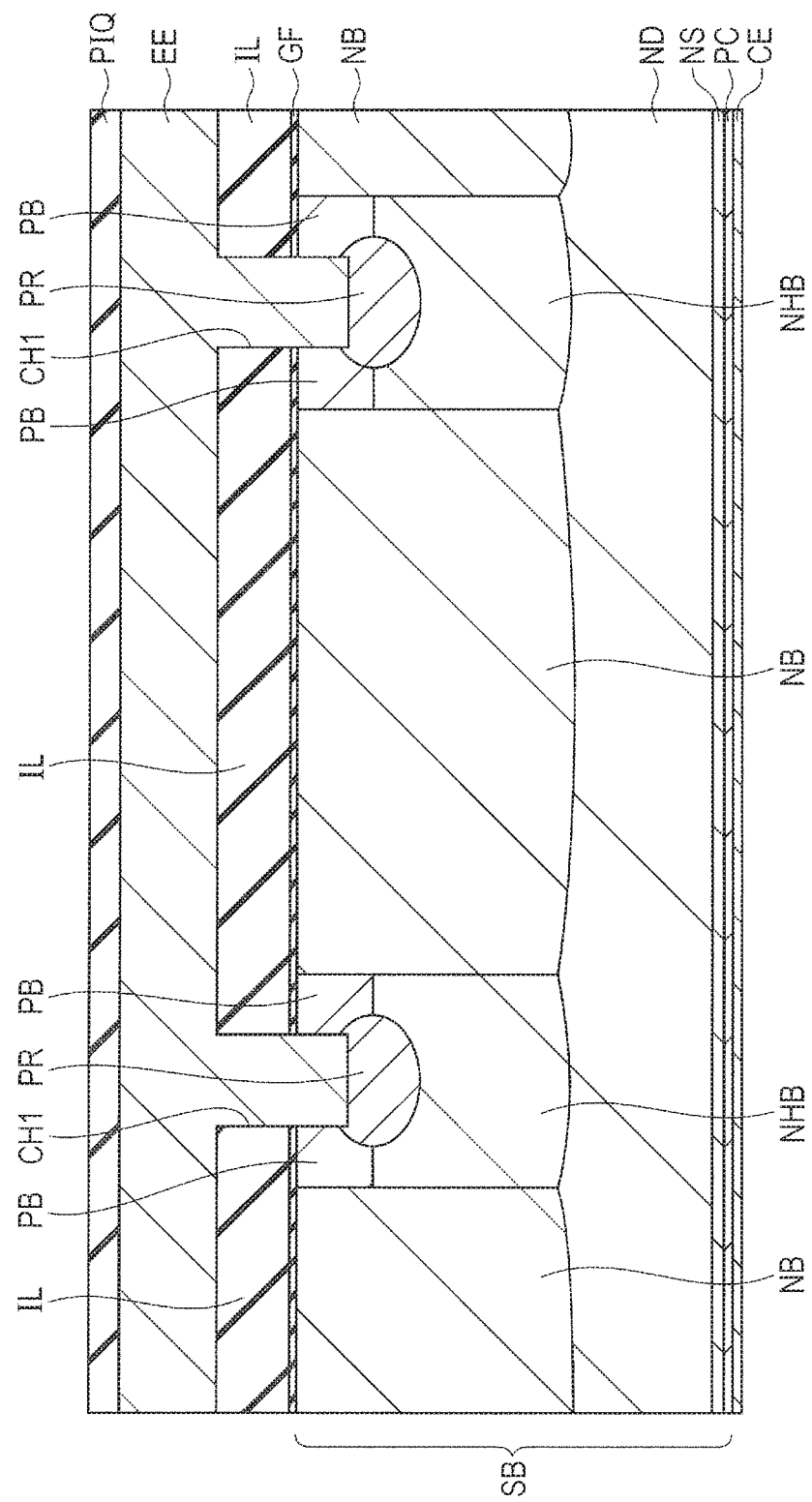
FIG. 23 is a sectional view of the semiconductor device of the third embodiment.

On the other hand, in the third embodiment, as shown in FIGS. 22 and 23, the isolation region NB is formed while the base region PB and the floating region PF are not formed. That is, only the isolation region NB is formed between the respective hybrid cell regions HBC in the active cell region AC.

The third embodiment therefore provides a small effect of reducing the electric field in the vicinity of the bottom of the trench T2 compared with the first embodiment, leading to a reduction in the withstand voltage of the IGBT. However, if an IGBT secures a withstand voltage only by a portion with a small distance between the trenches T1 and T2, the IGBT may use the structure of the third embodiment without problems.

In the third embodiment, since no p-type impurity region such as the base region PB and the floating region PF exists in the active cell region AC excluding the hybrid cell regions HBC, no potential variation occurs in the vicinity of the gate electrode G1. The hole discharge path is limited to a path on a side close to the floating region PF in the inactive cell region IAC. As a result, the IE effect is improved and thus the switching loss is further reduced at turn-on of the IGBT in the semiconductor device of the third embodiment compared with in the semiconductor device of the first embodiment.

First Modification of Third Embodiment

A semiconductor device of a first modification of the third embodiment is described below with reference to FIGS. 24 and 25.

Figure 24:
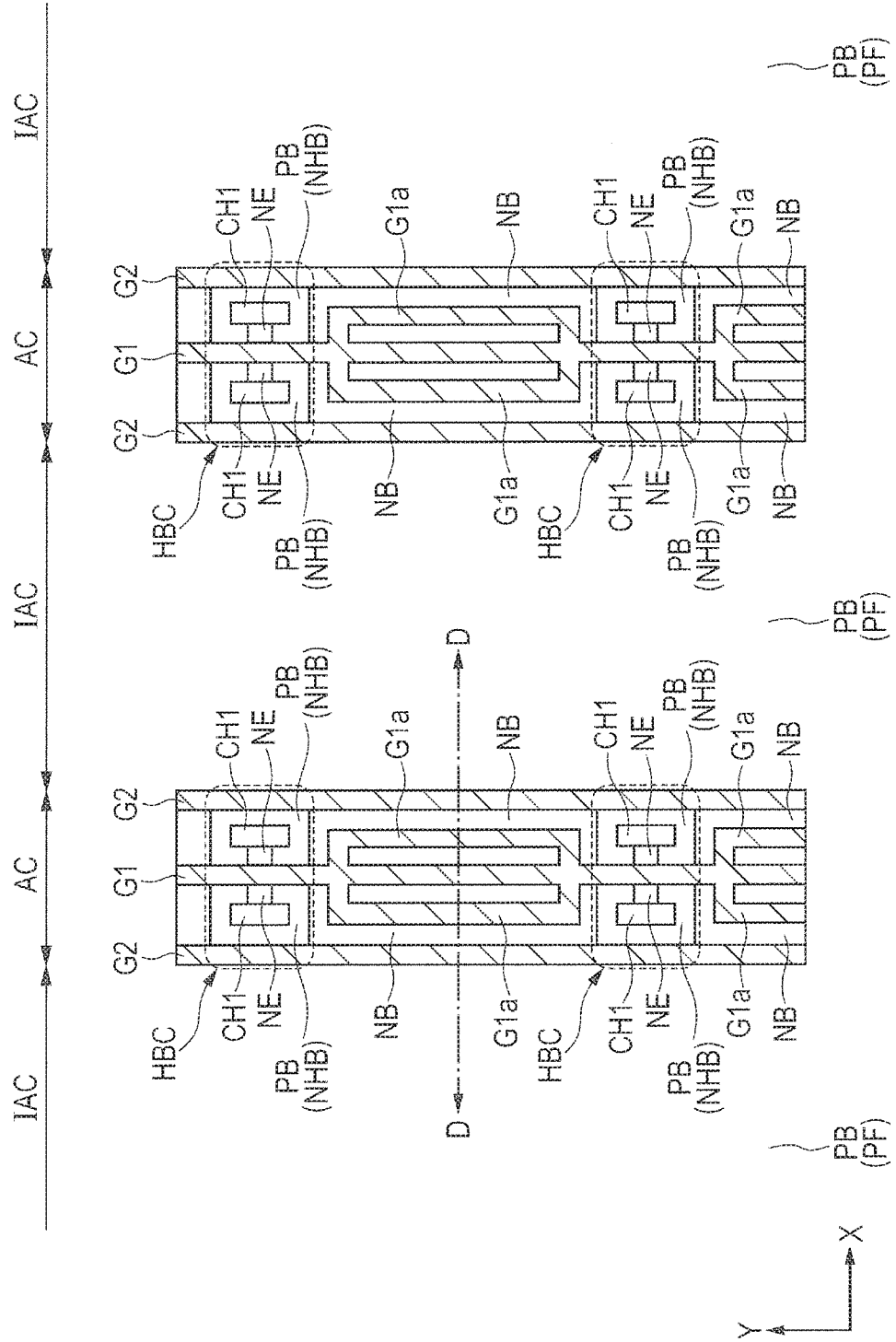
FIG. 24 is a major-part plan view of a semiconductor device of a first modification of the third embodiment.
Figure 25:
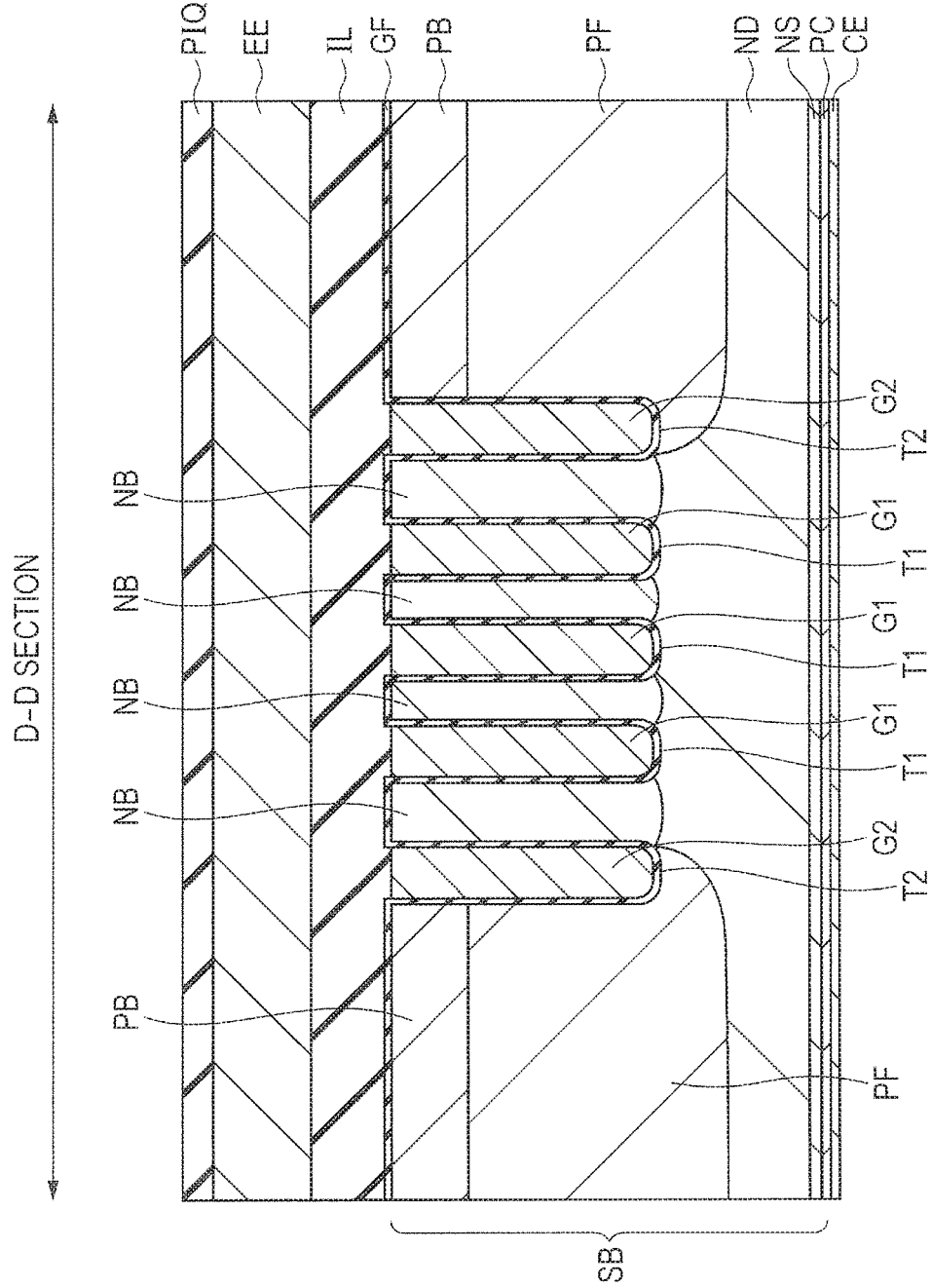
FIG. 25 is a sectional view of the semiconductor device of the first modification of the third embodiment.

FIG. 24 is a major-part plan view of a semiconductor chip CHP, showing the same portion as FIG. 2 in the first embodiment. FIG. 25 is a sectional view along a line D-D in FIG. 24.

In the first modification, as in the third embodiment, the isolation region NB is formed between the respective hybrid cell regions HBC in the active cell region AC. In the first modification, a plurality of branched gate electrodes G1a each having the gate potential are formed in the isolation region NB.

Such branched gate electrodes G1a are gathered into one gate electrode G1 again in the hybrid cell region HBC. That is, the gate electrode G1 is integrated with the branched gate electrodes G1a. Gate capacitance can be increased by the plurality of gate electrodes G1a provided in the isolation region NB as a high-concentration n-type impurity region.

For example, the EGE structure has a small gate capacitance that disadvantageously causes an abrupt current increase to a rated current or higher at turn-on, or resonance (oscillation) occurring in a loop in a module including a plurality of IGBTs coupled in parallel. It is possible to increase the gate capacitance without secondary effects by using the technique of the first modification. This in turn makes it possible to overcome the disadvantages of the EGE structure, e.g., increase the dumping capacity, and possible to improve the IE effect as with the third embodiment.

Second Modification of Third Embodiment

A semiconductor device of a second modification of the third embodiment is described below with reference to FIGS. 26 and 27.

Figure 26:
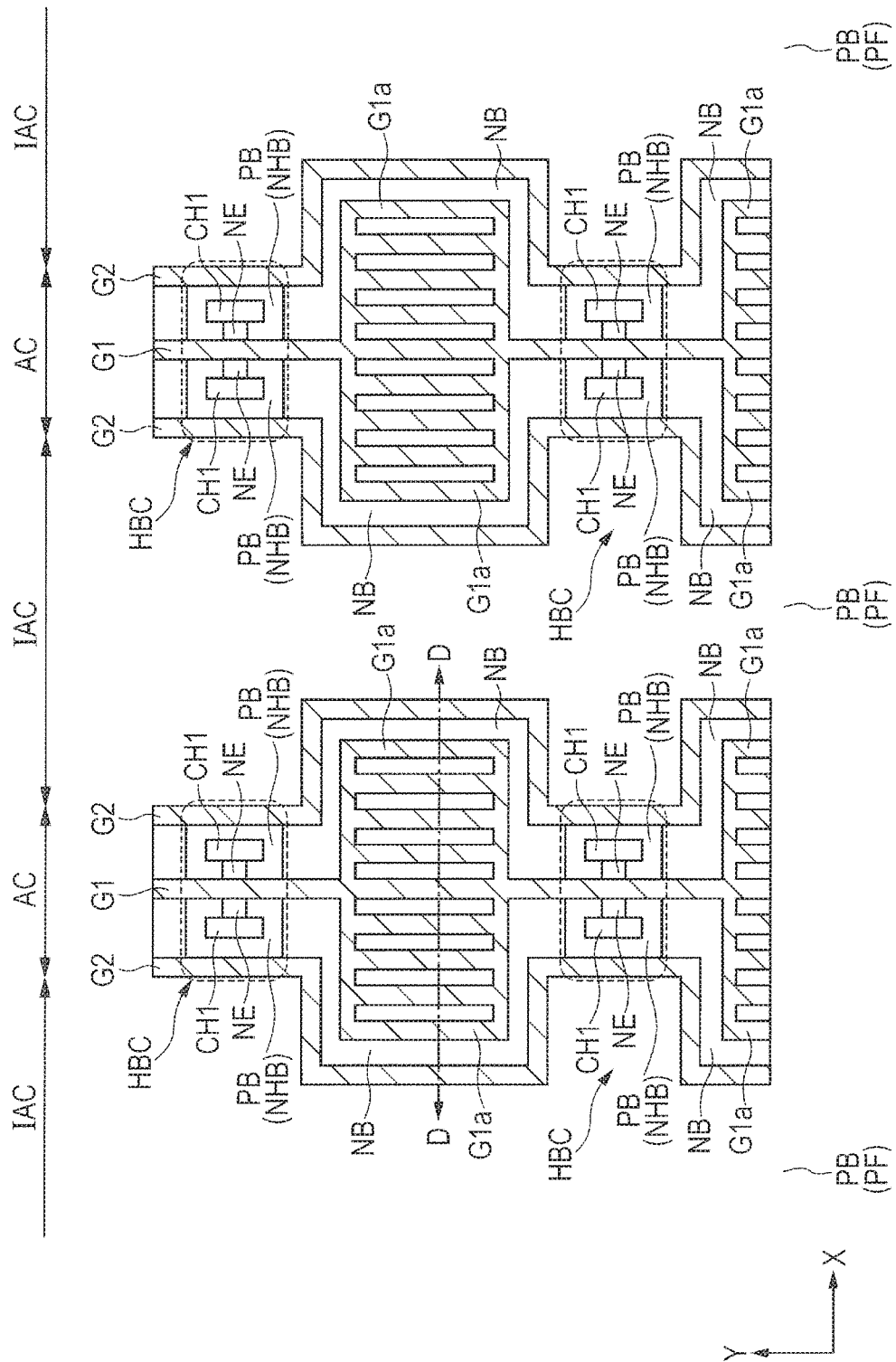
FIG. 26 is a major-part plan view of a semiconductor device of a second modification of the third embodiment.
Figure 27:
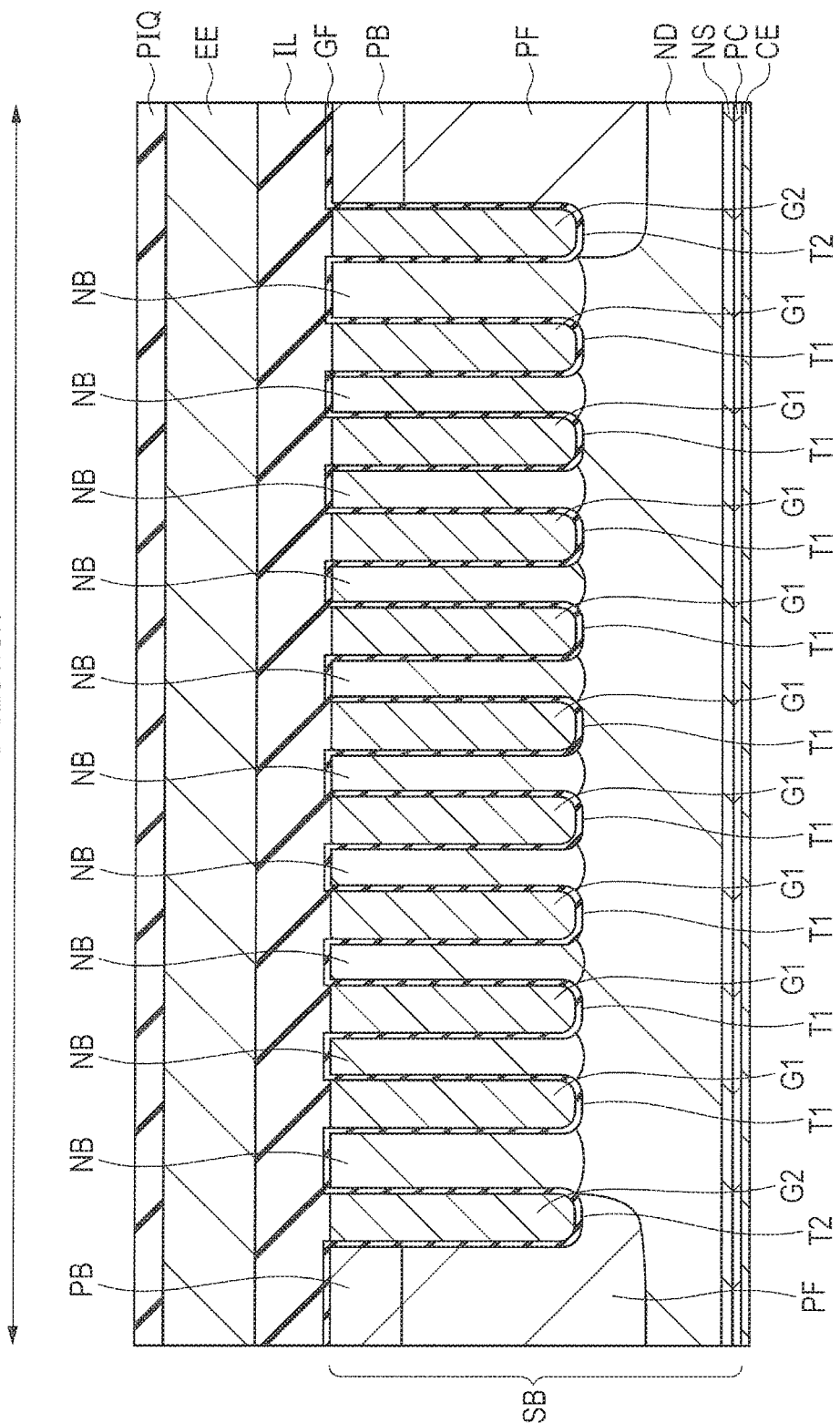
FIG. 27 is a sectional view of the semiconductor device of the second modification of the third embodiment.

FIG. 26 is a major-part plan view of a semiconductor chip CHP, showing the same portion as FIG. 2 in the first embodiment. FIG. 27 is a sectional view along a line D-D in FIG. 26.

In the second modification, as in the first modification of the third embodiment, the isolation region NB is formed between the respective hybrid cell regions HBC in the active cell region AC, and a plurality of branched gate electrodes G1a each having a gate potential are formed in the isolation region NB. As in the third embodiment, the isolation region NB is located between the respective gate electrodes G2 in the X direction.

In the second modification, the active cell region AC excluding the hybrid cell region HBC is expanded in the X direction. That is, a width of the isolation region NB is made larger than a width of the hybrid cell region HBC in the X direction. In other words, a distance between the two gate electrodes G2 formed in the active cell region AC excluding the hybrid cell region HBC is larger than a distance between the two gate electrodes G2 formed in the hybrid cell region HBC.

This makes it possible to further increase the number of the gate electrodes G1a in the second modification compared with in the first modification, resulting in a further increase in gate capacitance.

Fourth Embodiment

A semiconductor device of a fourth embodiment is described below with reference to FIGS. 28 and 29.

Figure 28:
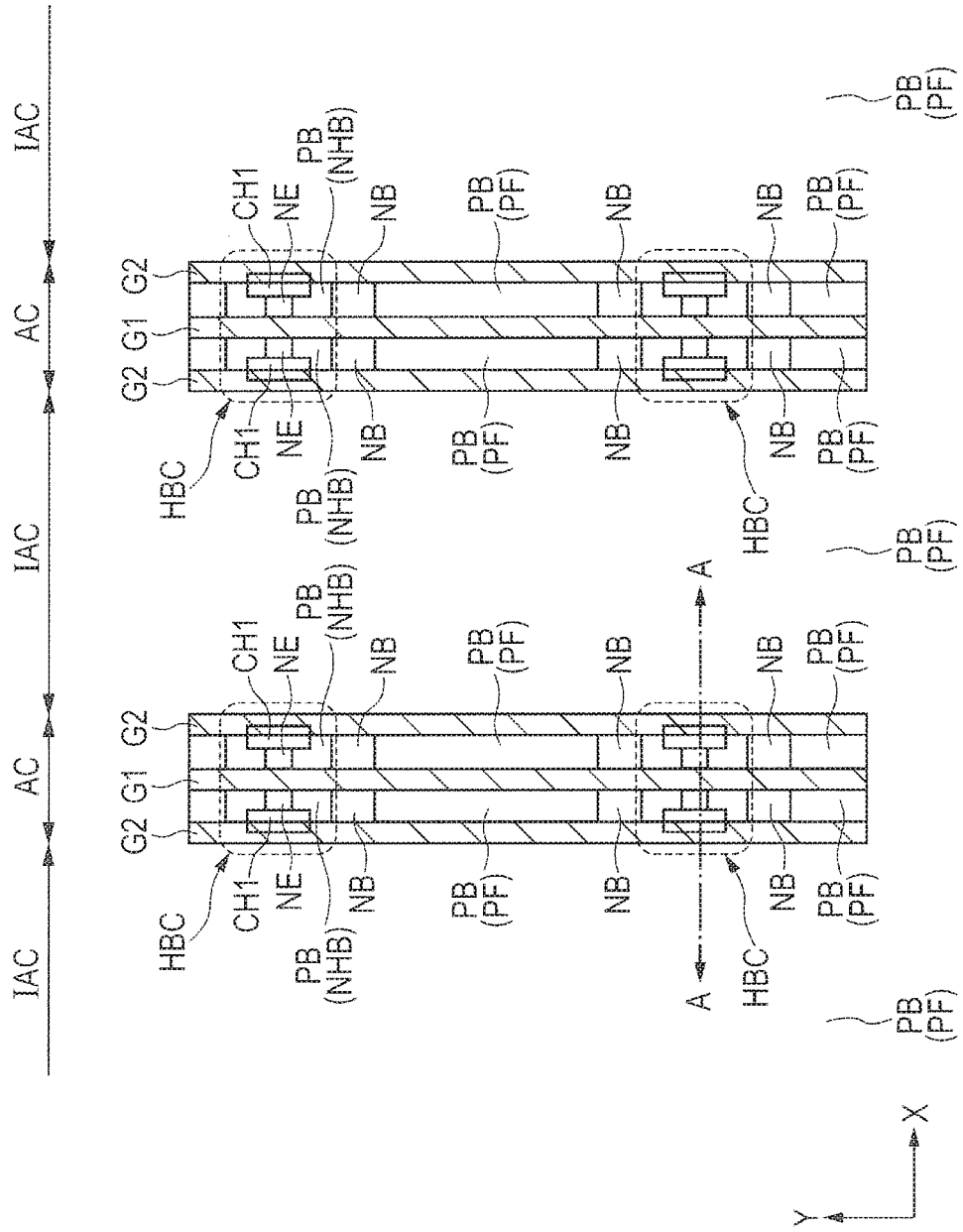
FIG. 28 is a major-part plan view of a semiconductor device of a fourth embodiment.

FIG. 28 is a major-part plan view of a semiconductor chip CHP, showing the same portion as FIG. 2 in the first embodiment. FIG. 29 is a sectional view along a line A-A in FIG. 28.

The semiconductor device of the fourth embodiment is an IE IGBT having a shrunken EGE structure, called EGE-S structure. The EGE-S structure is one EGE structure as in the first embodiment, in which however a space between the gate electrodes G1 and G2 is reduced compared with in the first embodiment.

Figure 29:
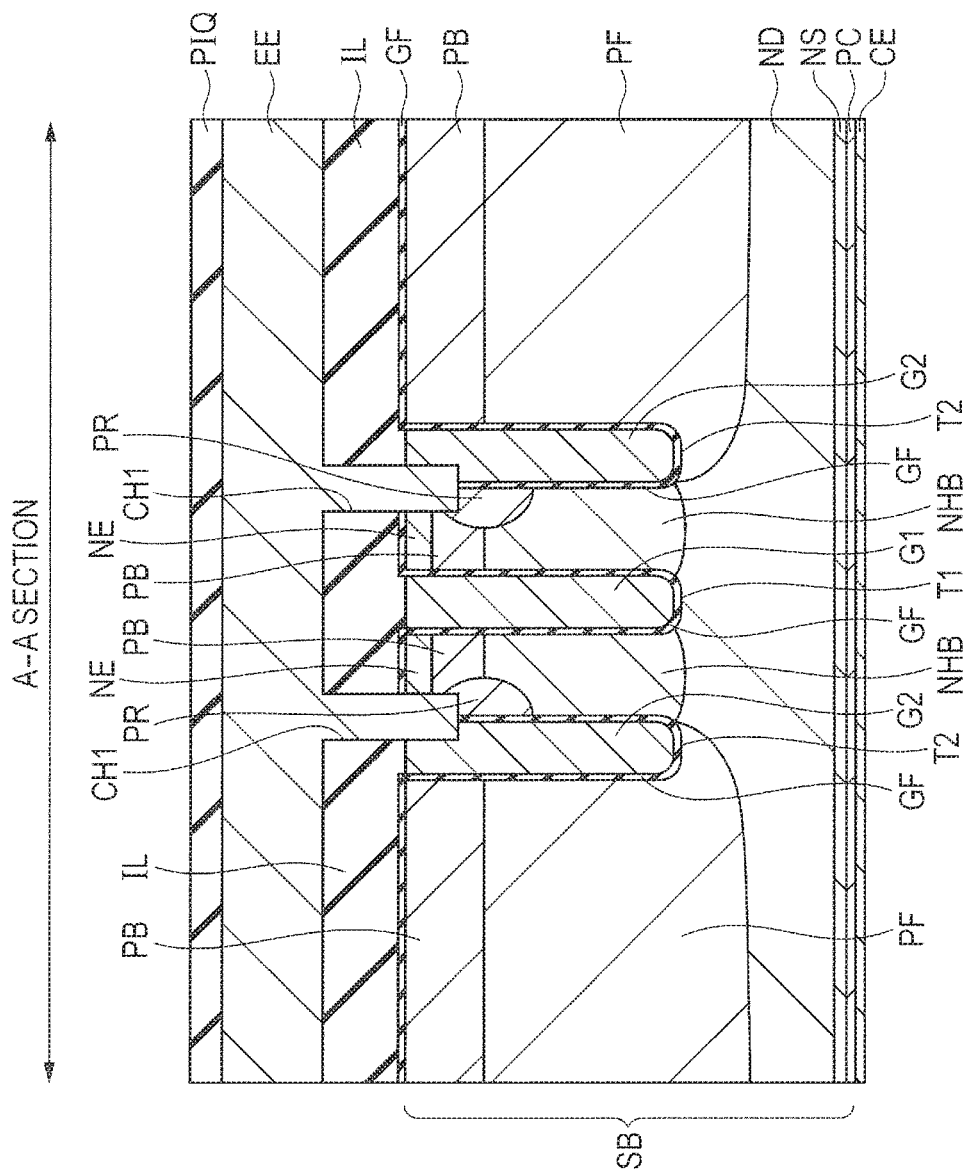
FIG. 29 is a sectional view of the semiconductor device of the fourth embodiment.

As shown in FIGS. 28 and 29, the contact hole CH1 is formed so as to be in contact with the gate electrode G2 in addition to the emitter region NE, the base region PB, and the body region PR. It is therefore not necessary to separately provide a coupling region for the gate electrode G2 and a contact hole to be coupled to the coupling region, making it possible to reduce the width of the active cell region AC in the X direction. Consequently, the semiconductor device can be reduced in size.

In the fourth embodiment, as in the first embodiment, the isolation region NB is provided in a region adjacent to the hybrid cell regions HBC in the active cell region AC. The semiconductor device of the fourth embodiment therefore can provide the effects similar to those of the semiconductor device of the first embodiment, and can be reduced in size. The technique described in each of the second and third embodiments may be applied to the fourth embodiment.

Fifth Embodiment

A semiconductor device of a fifth embodiment is described below with reference to FIGS. 30 and 31.

Figure 30:
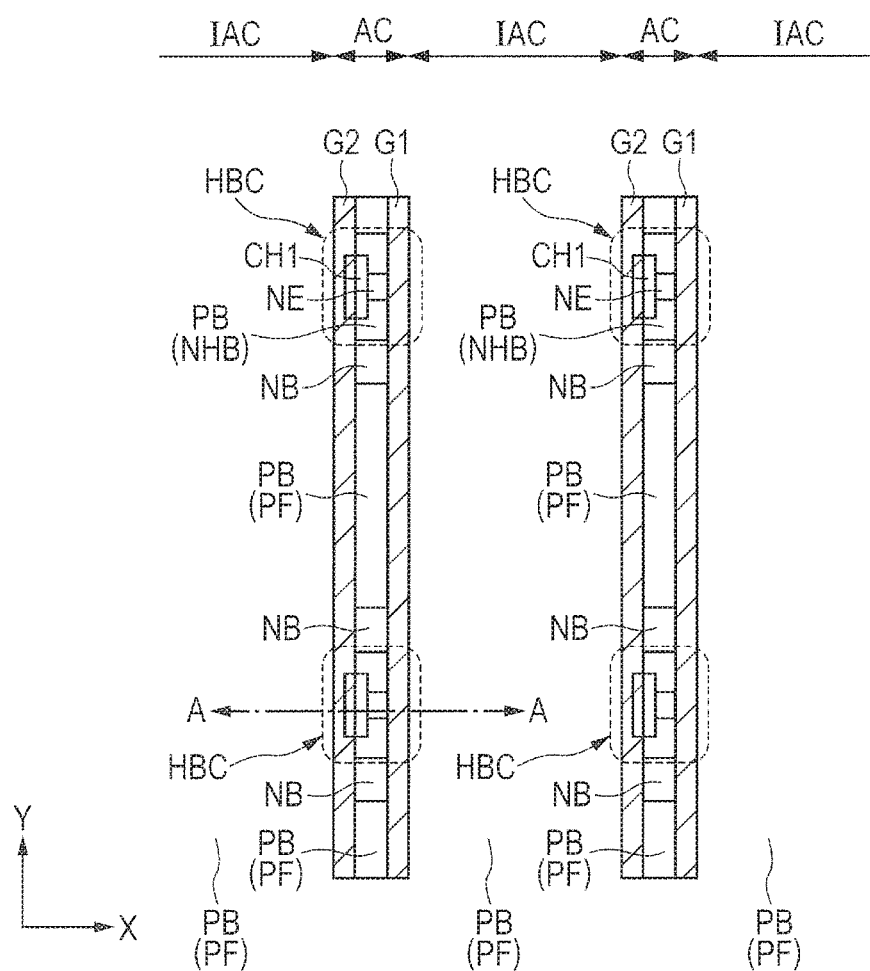
FIG. 30 is a major-part plan view of a semiconductor device of a fifth embodiment.

FIG. 30 is a major-part plan view of a semiconductor chip CHP, showing the same portion as FIG. 2 in the first embodiment. FIG. 31 is a sectional view along a line A-A in FIG. 30.

The semiconductor device of the fifth embodiment is an IE IGBT having a structure called GE-S structure. The GE-S structure is based on the EGE-S structure of the fourth embodiment, from which however one gate electrode G2 is omitted.

Figure 31:
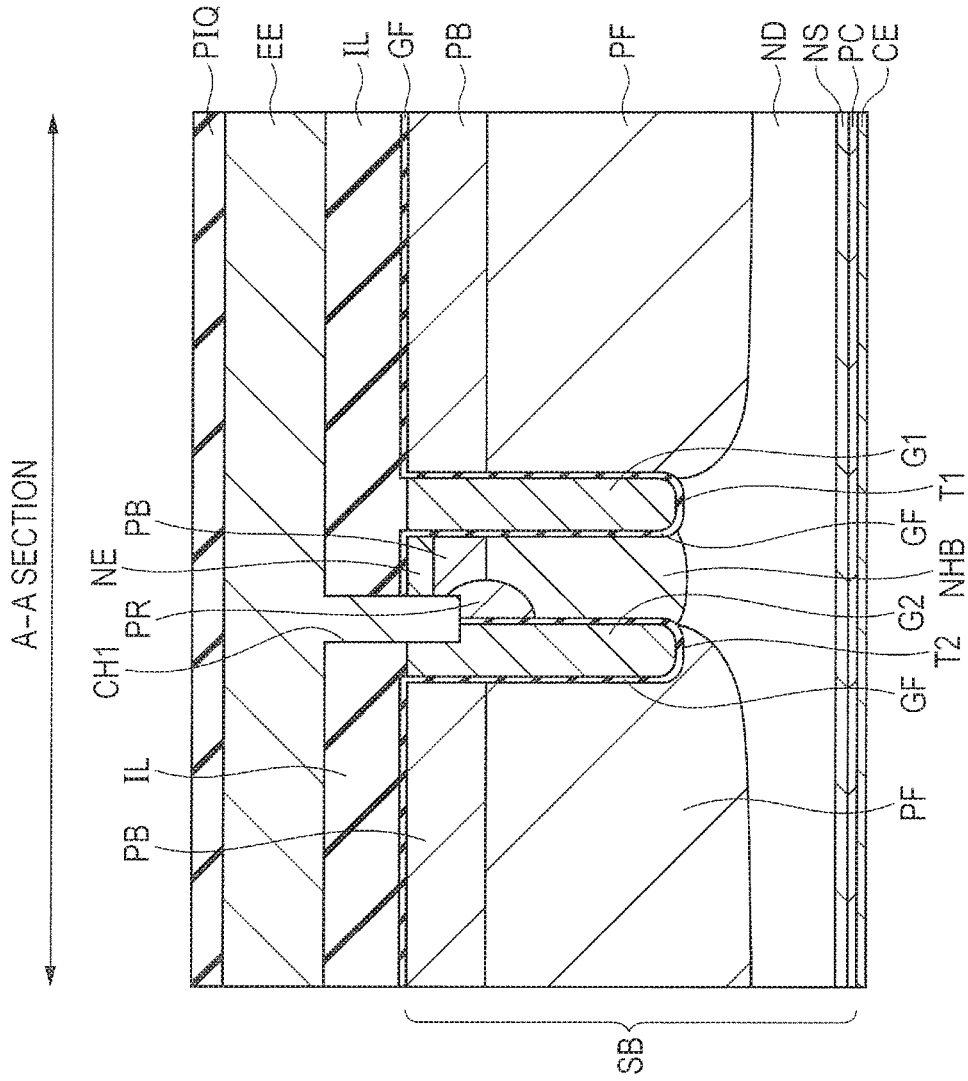
FIG. 31 is a sectional view of the semiconductor device of the fifth embodiment.

As shown in FIGS. 30 and 31, in the fifth embodiment, the active cell region AC is configured of one gate electrode G1, one gate electrode G2, and a region between the gate electrodes G1 and G2. As in the fourth embodiment, the contact hole CH1 is formed so as to be in contact with the gate electrode G2 in addition to the emitter region NE, the base region PB, and the body region PR.

In the GE-S structure, a potential variation tends to occur in the floating region PF adjacent to the gate electrode G1 having a gate potential. However, since the gate electrode G2 in another active cell region AC adjacent in the X direction has an emitter potential, holes stored in such a floating region PF can be discharged by performing parasitic p-type MOSFET operation in the adjacent active cell region AC.

In the fifth embodiment, as in the first embodiment, the isolation region NB is provided in a region adjacent to the hybrid cell regions HBC in the active cell region AC. The semiconductor device of the fifth embodiment therefore can provide the effects similar to those of the semiconductor device of the first embodiment, and can be further reduced in size compared with the fourth embodiment. The technique described in each of the second and third embodiments may be applied to the fifth embodiment.

Sixth Embodiment

A semiconductor device of a sixth embodiment is described below with reference to FIGS. 32 and 33.

Figure 32:
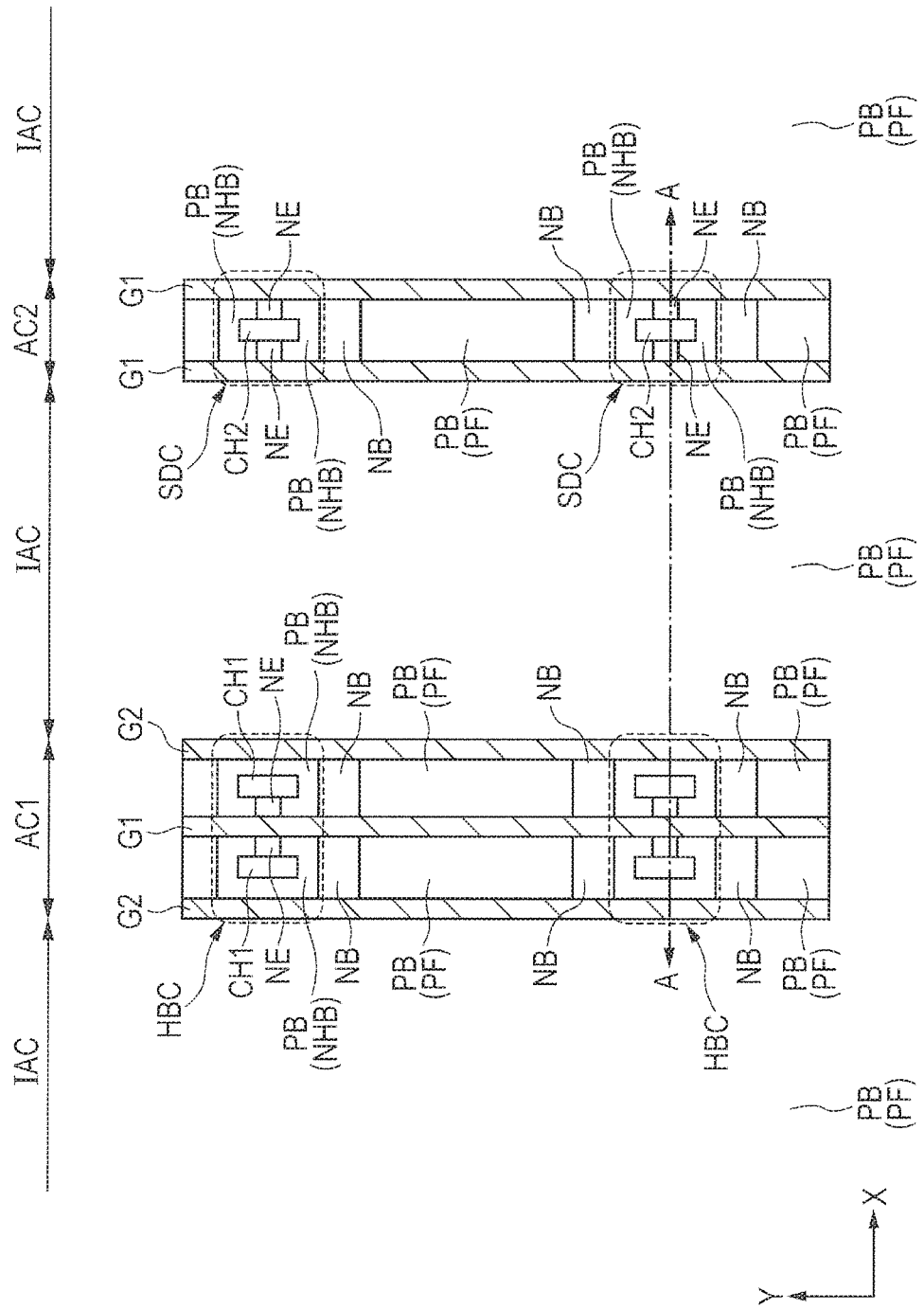
FIG. 32 is a major-part plan view of a semiconductor device of a sixth embodiment.

FIG. 32 is a major-part plan view of a semiconductor chip CHP, showing the same portion as FIG. 2 in the first embodiment. FIG. 32 is a sectional view along a line A-A in FIG. 32.

The semiconductor device of the sixth embodiment is an IE IGBT having a structure called EGE-GG structure. In the EGE-GG structure, cells having the GG structure are disposed in addition to the cells having the EGE structure as described in the first embodiment and the like.

Figure 33:
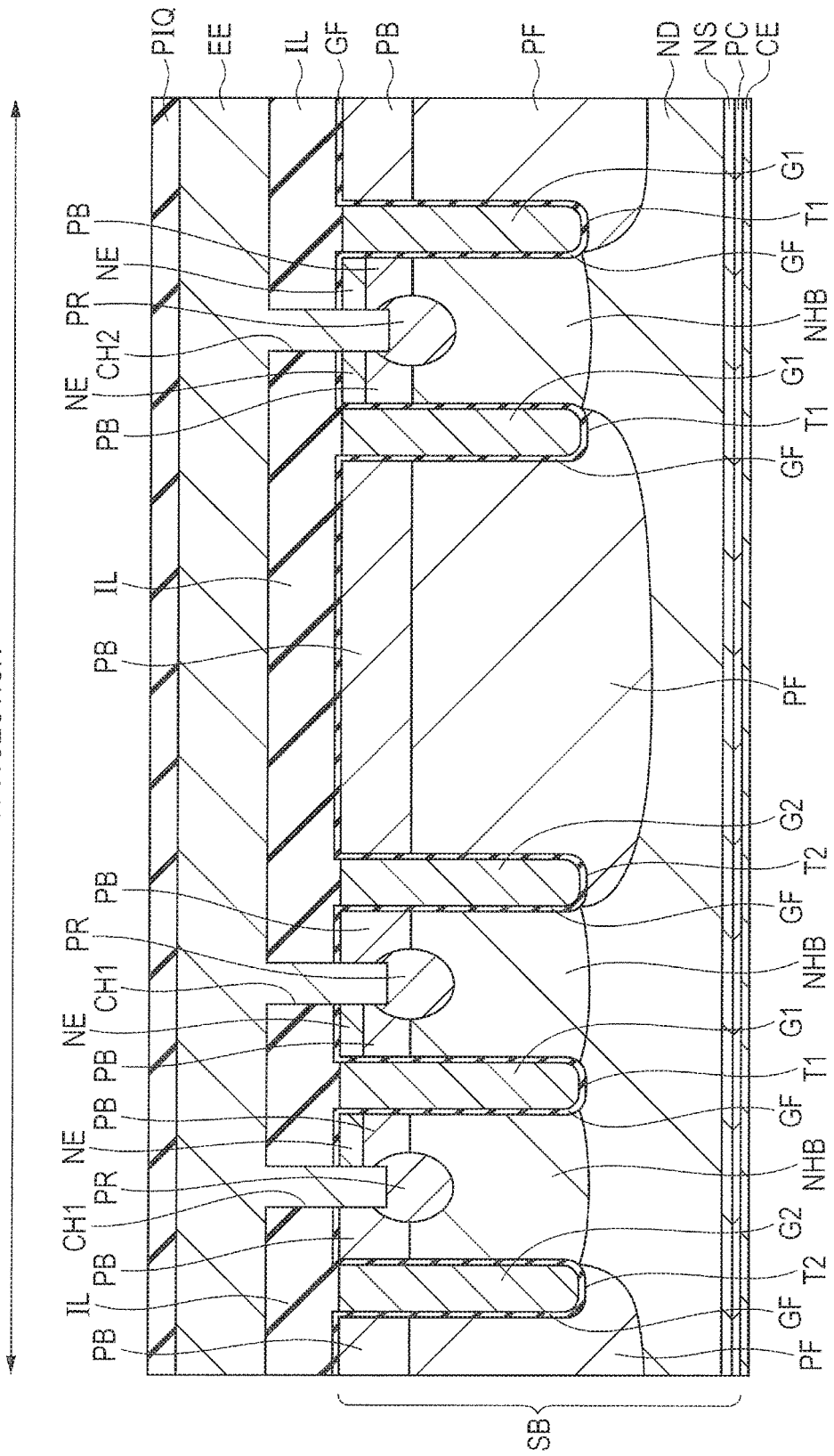
FIG. 33 is a sectional view of the semiconductor device of the sixth embodiment.

As shown in FIGS. 32 and 33, the semiconductor device of the sixth embodiment includes a first active cell region AC1 including the hybrid cell region HBC having the EGE structure, a second active cell region AC2 including a standard cell SDC having the GG structure, and an inactive cell region IAC located between the first and second active cell regions AC1 and AC2.

Since the first active cell region AC1 and the inactive cell region IAC in the sixth embodiment have the same configurations as the active cell region AC and the inactive cell region IAC in the first embodiment, duplicated description is omitted.

The second active cell region AC2 includes a region located between the two gate electrodes G1 electrically coupled to the gate potential electrode GE. In the second active cell region AC2, a region having the emitter region NE corresponds to the standard cell SDC. In the standard cell SDC, the base region PB is formed in the surface of the hole barrier region NHB, and the emitter region NE is formed in the surface of the base region PB. In addition, a contact hole CH2 is disposed in the standard cell SDC, and the body region PR is formed in the vicinity of the bottom of the contact hole CH2. The emitter potential electrode EE is buried in the contact hole CH2 as with the contact hole CH1. Specifically, in the standard cell SDC, an emitter potential is applied to the emitter region NE, the base region PB, and the body region PR during operation of the IGBT.

A configuration of the second active cell region AC2 excluding the standard cell SDC is similar to a configuration of the first active cell region AC1 excluding the hybrid cell regions HBC. That is, the n-type isolation region NB, the floating region PF as well as the base region PB, and the n-type isolation region NB are provided between the respective standard cells SDC adjacent in the Y direction.

In the second active cell region AC2, the gate electrode G2 having an emitter potential is not formed unlike in the first active cell region AC1. Hence, a potential variation tends to occur in the floating region PF in the inactive cell region IAC adjacent to the gate electrode G1 having the gate potential and in the floating region PF in the second active cell region AC2. However, holes stored in such regions can be discharged by performing parasitic p-type MOSFET operation in the hybrid cell region HBC adjacent in the X direction.

In the semiconductor device of the sixth embodiment, a cell having the GG structure is added to a cell having the EGE structure, leading to an effect of easy adjustment of the gate capacitance. For only the EGE structure as in the first embodiment, dumping capacitance cannot be secured due to a too small gate capacitance. For the GGEE structure, switching loss tends to increase due to a too large gate capacitance. In a possible approach to adjust the gate capacitance based on each structure, a width of the floating region PF is varied to adjust the density of the active cell region AC. However, varying the width of the floating region PF results in variations in characteristics other than the gate capacitance, such as a switching characteristic or a forward saturation voltage VCE (sat) characteristic.

In the EGE-GG structure as in the sixth embodiment, it is possible to adjust the gate capacitance while a ratio of the width of the first active cell region AC1 to the width of the inactive cell region IAC (floating region PF) and a ratio of the width of the second active cell region AC2 to the width of the inactive cell region IAC are each maintained to 1:2 to 1:3, and thus increase the degree of freedom in design. In other words, such a ratio can be maintained to 1:2 to 1:3, which is an ideal value for low switching loss at turn-off in a tradeoff relationship between the forward saturation voltage VCE(sat) and the switching loss at turn-off.

That is, in the semiconductor device of the sixth embodiment, it is possible to provide the effects substantially similar to those of the semiconductor device of the first embodiment, and easily adjust the gate capacitance compared with the first embodiment. The technique described in each of the second to fifth embodiments may be applied to the first active cell region AC1 in the sixth embodiment.

Seventh Embodiment

A semiconductor device of a seventh embodiment is described below with reference to FIGS. 34 and 35.

Figure 34:
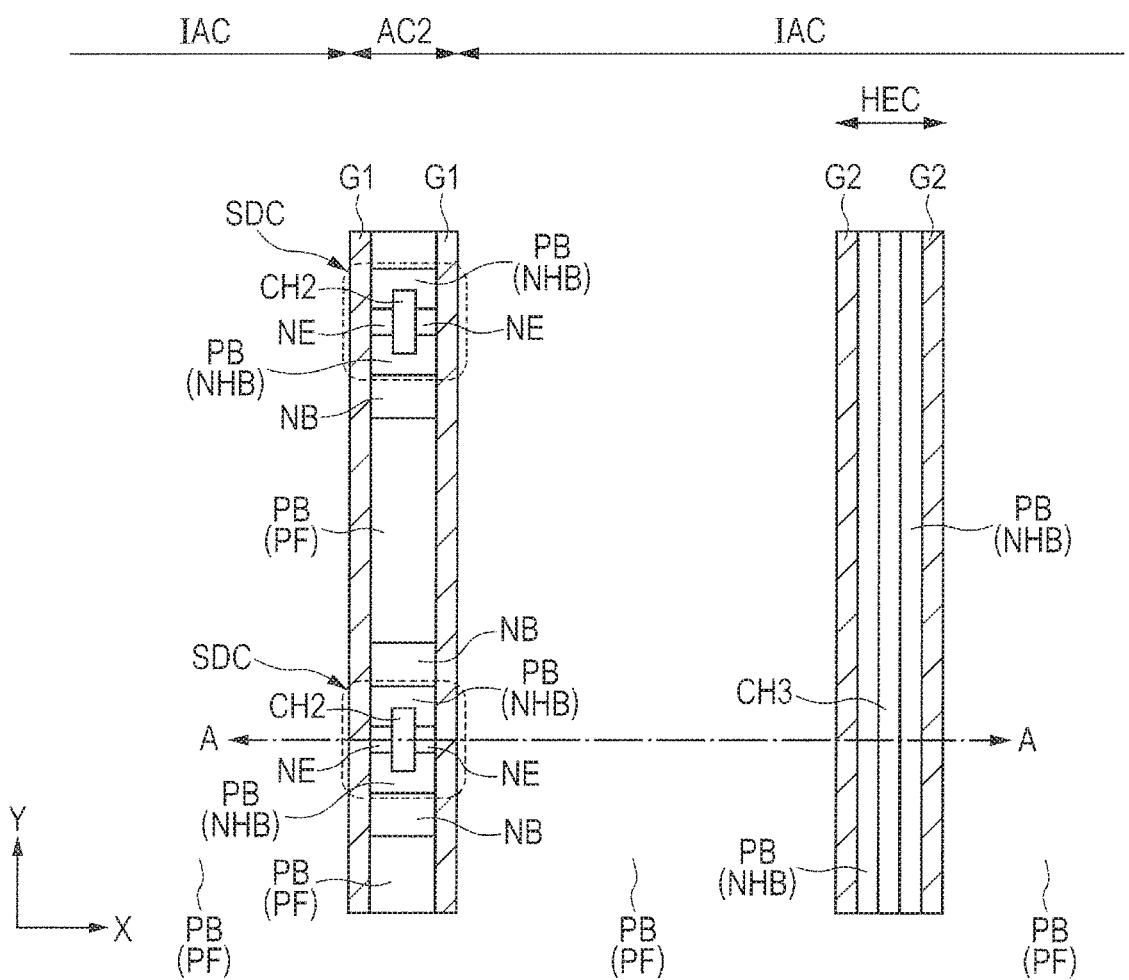
FIG. 34 is a major-part plan view of a semiconductor device of a seventh embodiment.

FIG. 34 is a major-part plan view of a semiconductor chip CHP, showing the same portion as FIG. 2 in the first embodiment. FIG. 35 is a sectional view along a line A-A in FIG. 34.

The semiconductor device of the seventh embodiment is an IE IGBT having a GGEE structure.

Figure 35:
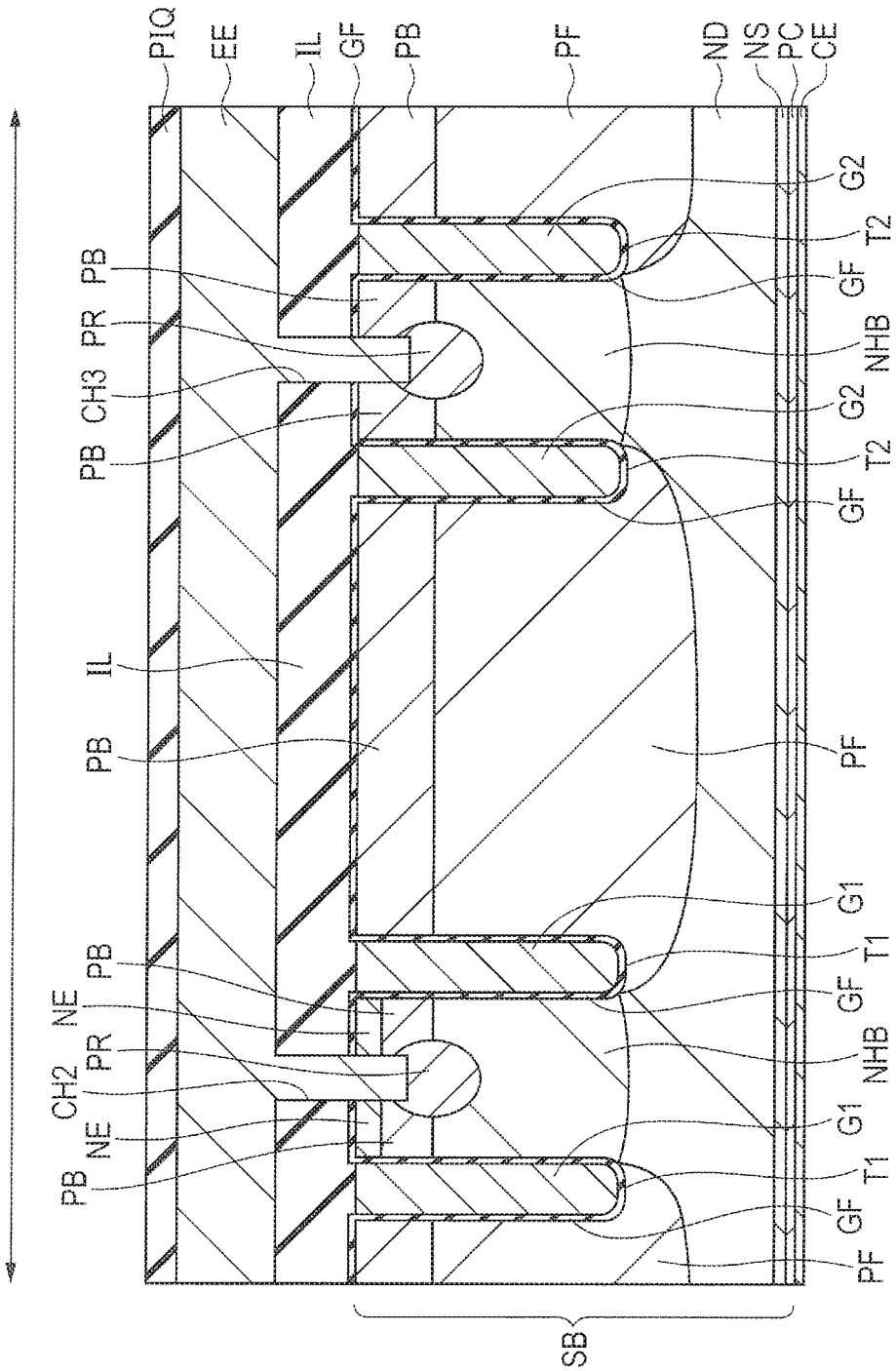
FIG. 35 is a sectional view of the semiconductor device of the seventh embodiment.

As shown in FIGS. 34 and 35, the semiconductor device of the seventh embodiment includes an active cell region AC2 including standard cells SDC having a GG structure and the inactive cell region IAC. The inactive cell region IAC has a hole discharge cell HEC having the EE structure.

Since the active cell region AC2 and the inactive cell region IAC in the seventh embodiment have substantially the same configurations as those in the sixth embodiment, duplicated description is omitted.

The hole discharge cell HEC includes a region located between the two gate electrodes G2 electrically coupled to the emitter potential electrode EE. In the hole discharge cell HEC, the base region PB is formed in the surface of the hole barrier region NHB, and no emitter region NE is formed in the base region PB. In the hole discharge cell HEC, a contact hole CH3 is disposed, and the body region PR is formed in the vicinity of the bottom of the contact hole CH3. The emitter potential electrode EE is buried in the contact hole CH3 as with the contact hole CH1. That is, in the hole discharge cell HEC, an emitter potential is applied to the base region PB and the body region PR during operation of the IGBT.

The hole discharge cell HEC is a region provided to perform the parasitic p-type MOSFET operation as described on the hybrid cell region HBC.

The semiconductor device of the seventh embodiment includes the standard cell SDC having the GG structure instead of the EGE structure as of the hybrid cell region HBC, but has the n-type isolation region NB, the floating region PF as well as the base region PB, and the n-type isolation region NB between the respective standard cells SDC adjacent in the Y direction. Hence, as with the hybrid cell region HBC in the first embodiment, it is possible to improve the IE effect and reduce the switching loss at turn-on of the IGBT.

The technique described in each of the second and third embodiments may be applied to the seventh embodiment.

Eighth Embodiment

A semiconductor device of an eighth embodiment is described below with reference to FIGS. 36 and 37.

There is now described an example where the semiconductor device of the eighth embodiment is a module having a plurality of semiconductor chips CHP, each including one of the IGBTs described in the first to seventh embodiments, coupled to one another in parallel.

Figure 36:
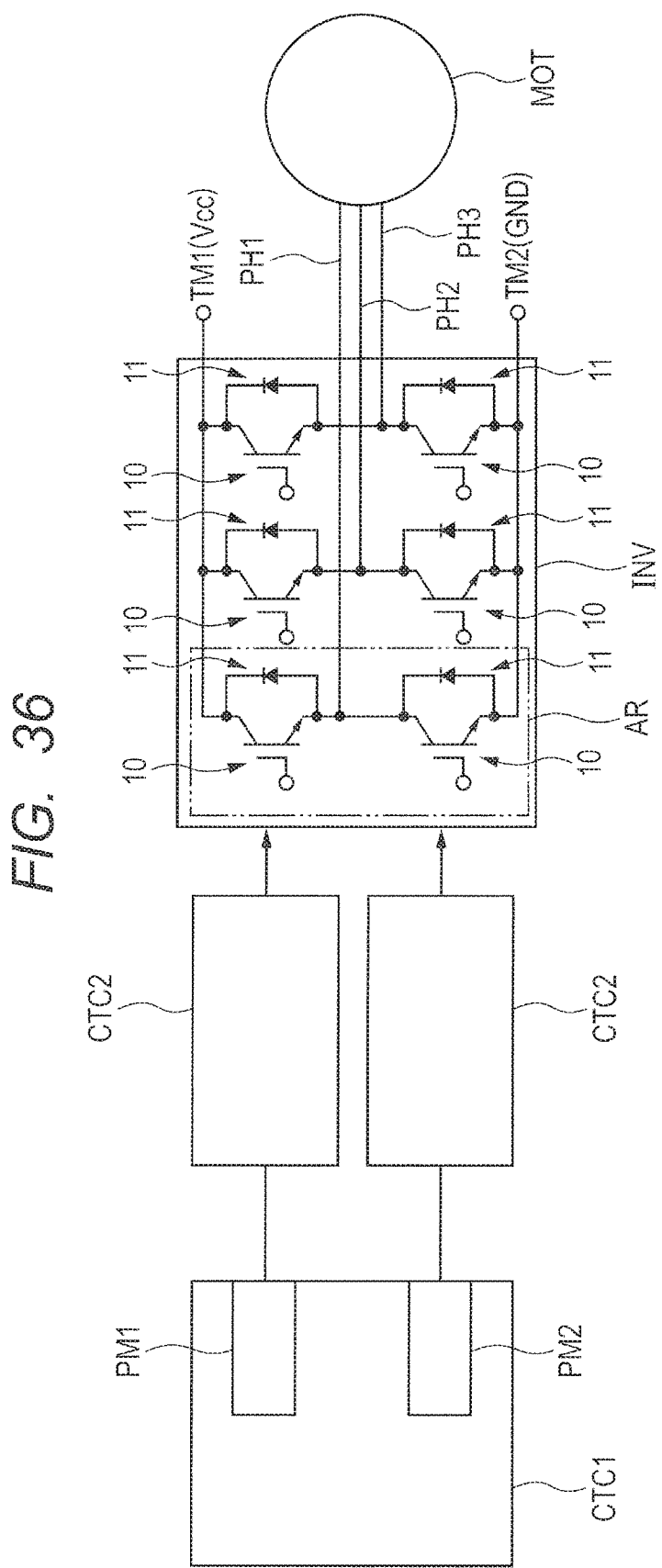
FIG. 36 is a circuit block diagram showing an example of an electronic system using a semiconductor device of an eighth embodiment.

FIG. 36 is a circuit block diagram showing an example of an electronic system using the semiconductor device of the eighth embodiment. FIG. 37 is an equivalent circuit diagram showing a module as the semiconductor device of the eighth embodiment. FIG. 37 shows two IGBT modules 10 corresponding to a U phase PH1 among six IGBT modules 10 included in an inverter INV shown in FIG. 36.

As shown in FIG. 36, the electronic system using the semiconductor device of the eighth embodiment includes a load such as a motor MOT, an inverter INV, a control circuit CTC1, and a control circuit CTC2. Such an electronic system includes, for example, a photovoltaic power system or a wind power generation system. A three-phase motor is used as the motor MOT. The three-phase motor is configured to be driven by a three-phase voltage having different phases. The control circuit CTC1 includes a plurality of power modules PM1 and PM2.

In the electronic system shown in FIG. 36, output of an undepicted power generation module in, for example, a photovoltaic power system, a wind power generation system, or an uninterruptible power supply (UPS) is coupled to input terminals TM1 and TM2 of the inverter INV, and a DC voltage, or DC power, of the power generation module is supplied to the inverter INV.

The control circuit CTC1 is configured of, for example, an electronic control unit (ECU), and incorporates a control semiconductor chip such as a micro controller unit (MCU). The control circuit CTC1 includes a plurality of power modules PM1 and PM2. The power modules PM1 and PM2 are each also configured of, for example, ECU, and incorporates a control semiconductor chip such as MCU.

The power modules PM1 and PM2 included in the control circuit CTC1 are coupled to the control circuit CTC2. The inverter INV is controlled by the control circuit CTC2. The control circuit CTC2 includes, for example a gate driver and a photocoupler. The undepicted gate driver included in the control circuit CTC2 is coupled to the inverter INV. Specifically, the gate driver included in the control circuit CTC2 is coupled to a gate electrode of an IGBT provided in the inverter INV.

The inverter INV is coupled to a motor MOT, and the DC voltage, or DC power, which is supplied to the inverter INV from the undepicted power generation module in, for example, the photovoltaic power system or the wind power generation system, is converted into an AC voltage, or AC power, by the inverter INV and supplied to the motor MOT. The motor MOT is driven by the AC voltage, or the AC power, supplied from the inverter INV.

In the example shown in FIG. 36, the motor MOT is a three-phase motor having a U phase PH1, a V phase PH2, and a W phase PH3. Hence, the inverter INV also corresponds to the three phases including the U phase PH1, the V phase PH2, and the W phase PH3. The inverter INV corresponding to such three phases has six sets in total of combinations of the IGBT modules 10 and diode modules 11.

The semiconductor device of the eighth embodiment corresponds to the IGBT module 10. The IGBT module 10 includes a plurality of IGBT chips 12 that each correspond to the semiconductor chip CHP shown in FIG. 1.

If the motor MOT is a two-phase motor, the inverter INV has four sets in total of the combinations of the IGBT modules 10 and the diode modules 11.

In the inverter INV, a potential side close to a supply voltage Vcc with respect to an input potential of the motor MOT is referred to as high side. In the inverter INV, a potential side close to a ground potential GND with respect to the input potential of the motor MOT is referred to as low side. In the example shown in FIG. 36, three IGBT modules 10 are used as high-side IGBT modules 10, and three IGBT modules 10 are used as low-side IGBT modules 10. In addition, three diode modules 11 are used as high-side diode modules 11, and three diode modules 10 are used as low-side diode modules 10.

Figure 37:
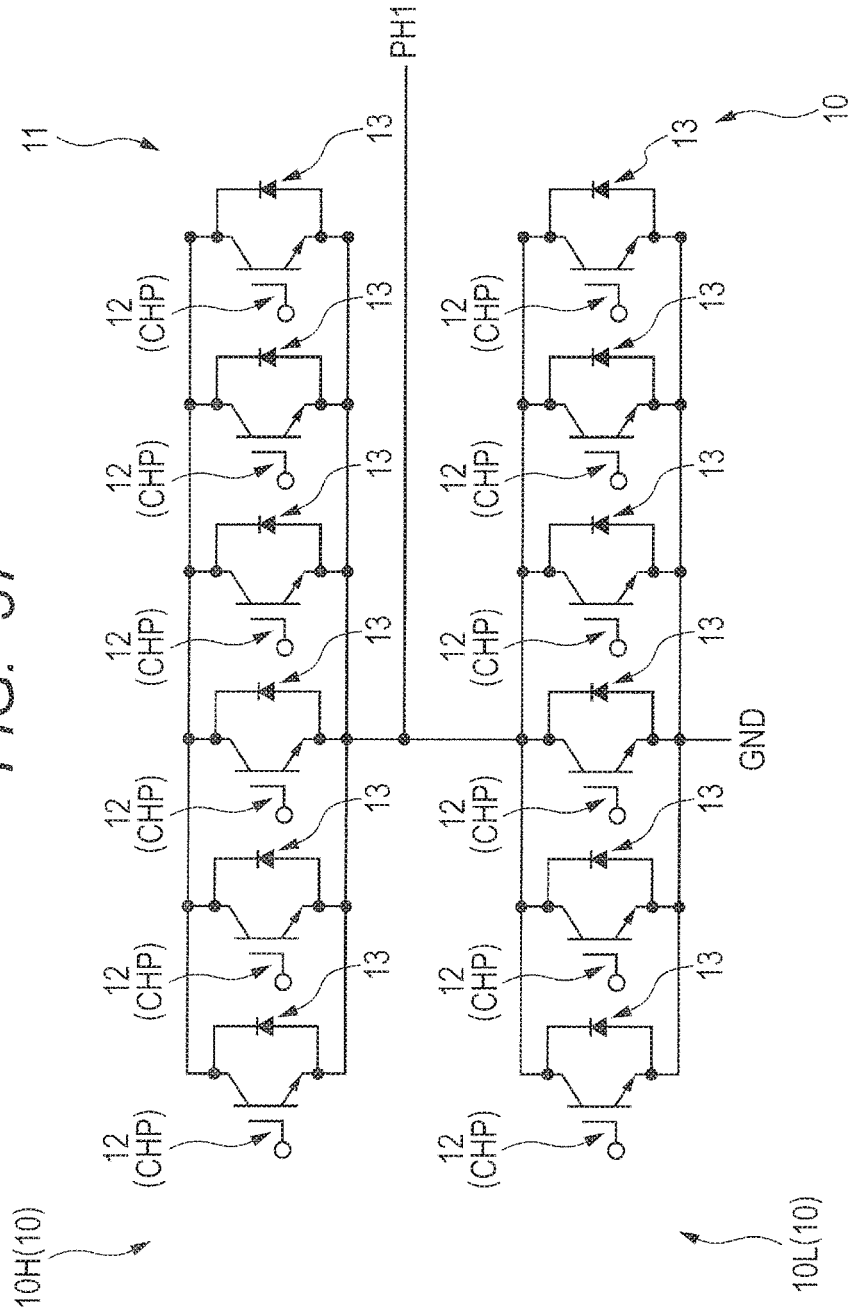
FIG. 37 is an equivalent circuit diagram showing a module as the semiconductor device of the eighth embodiment.

For example, a high-side IGBT module 10H in the two IGBT modules 10 corresponding to the U phase shown in the region AR in FIG. 36 includes a plurality of, for example, six IGBT chips 12 each including the semiconductor chip CHP as shown in FIG. 37. For example, a low-side IGBT module 10L in the two IGBT modules 10 corresponding to the U phase includes a plurality of, for example, six IGBT chips 12 each including the semiconductor chip CHP. In each of the high side and the low side, the emitter potential electrodes EE of the IGBT chips 12 are electrically coupled to one another, and the collector potential electrodes CE of the IGBT chips 12 are electrically coupled to one another.

In the example shown in FIG. 36, the IGBT modules 10 and the diode modules 11 are coupled in inverse parallel between the supply potential Vcc supplied to the inverter INV via the input terminals TM1 and TM2 and the input potential of the motor MOT, i.e., coupled in inverse parallel on the high side for each of the three phases including the U phase PH1, the V phase PH2, and the W phase PH3. The IGBT modules 10 and the diode modules 11 are coupled in inverse parallel between the input potential of the motor MOT and the ground potential GND, i.e., coupled in inverse parallel on the low side for each of the three phases including the U phase PH1, the V phase PH2, and the W phase PH3.

The control circuit CTC2 is coupled to each of the gate electrodes of the IGBT chips 12 included in each of the six IGBT modules 10, and controls the respective IGBT chips 12 in each of the six IGBT modules 10. As shown in FIG. 37, a plurality of diodes 13 are included in each of the six diode modules 11, and each diode 13 is coupled in inverse parallel with one IGBT chip CHP 12.

A current flowing through the IGBT module 10 is controlled using the control circuit CTC2 to rotate the motor MOT. Specifically, the control circuit CTC2 can be used to control on and off of the IGBT module 10 to drive the motor MOT. Although the IGBT module 10 is thus necessary to be turned on or off to drive the motor MOT, the motor MOT has inductance. Hence, when the IGBT module 10 is turned off, a current in a direction opposite to the current flow direction in the IGBT module 10 is generated due to the inductance of the motor MOT. Since the IGBT module 10 does not have a function of flowing the inverse current, the diode module 11 is provided in inverse parallel with the IGBT module 10, thereby the inverse current is refluxed to release energy stored in the inductance.

As described above, the semiconductor chip CHP described in each of the first to seventh embodiments is used in the IGBT chip 12 of the eighth embodiment. Each IGBT chip 12 is therefore reduced in switching loss at turn-on; hence, the inverter INV including the IGBT chips 12 can be driven by lower power than in the past. It is therefore possible to effectively use power in the photovoltaic power system, the wind power generation system, or UPS. In a power conditioner with power generation as an interface, it is possible to increase power generation amount by improving power efficiency.

For example, although the invention achieved by the inventors has been described in detail according to the embodiments hereinbefore, the invention should not be limited thereto, and it will be appreciated that various modifications or alterations thereof may be made within the scope without departing from the gist of the invention.

For example, although the embodiments have been described assuming that the ratio of the width of the active cell region AC to the width of the inactive cell region IAC is 1:2 to 1:3, the width ratio may be another ratio, for example, 1:1 or 1:4.

Part of the content described in each of the above embodiments is described below.

Supplementary Note 1

A method of manufacturing a semiconductor device that includes a first region extending in a first direction in plan view, a second region different from the first region, a third region disposed in the first region, a fourth region disposed in the first region so as to be adjacent to the third region in the first direction, and a fifth region extending in the first direction in the second region, includes the steps of:

(a) forming a first impurity region having a first conductivity type in a semiconductor substrate in each of the first region and the second region;

(b) forming a fifth impurity region in the first impurity region in the fourth region, the fifth impurity region having the first conductivity type and having a higher impurity concentration than the first impurity region;

(c) forming two first trenches extending in the first direction in the first impurity region in the first region, and forming two second trenches extending in the first direction in the first impurity region in the second region;

(d) forming a first gate insulating film over each of inner walls of the two first trenches, and forming a second gate insulating film over each of inner walls of the two second trenches;

(e) forming a first gate electrode over each of the two first gate insulating films so as to fill the two first trenches, and forming a second gate electrode over each of the two second gate insulating films so as to fill the two second trenches;

(f) forming a second impurity region having a second conductivity type opposite to the first conductivity type in the first impurity region between the two first gate electrodes in the third region, and in the first impurity region between the two second gate electrodes in the fifth region;

(g) forming a third impurity region having the first conductivity type in the second impurity region in the third region;

(h) forming a fourth impurity region having the second conductivity type in the semiconductor substrate below the first impurity region in each of the first region and the second region;

(i) forming a gate potential electrode to be electrically coupled to the first gate electrode, and forming an emitter potential electrode to be electrically coupled to the second impurity region, the third impurity region, and the second gate electrode; and (j) forming a collector potential electrode to be electrically coupled to the fourth impurity region, where the plural third regions are disposed so as to be separated from one another in the first direction in the first region, and the fourth region is disposed between the respective third regions.

Supplementary Note 2

The method according to supplementary note 1, further includes the steps of:

(k) between the step (h) and the step (i), forming an interlayer insulating film over the semiconductor substrate in each of the third regions;

(l) forming a plurality of first contact holes extending up to the second impurity region in the interlayer insulating film so as to be in contact with the second impurity region and the third impurity region; and (m) forming a sixth impurity region having the second conductivity type and having a higher impurity concentration than the second impurity region at each of positions having respective bottoms of the first contact holes in the second impurity region, where in the step (i), the emitter potential electrode is formed so as to fill each of the first contact holes.

Supplementary Note 3

The method according to supplementary note 1, where in the step (f), the second impurity region is also formed in the first impurity region in the fourth region, and the second impurity region in the third region is isolated from the second impurity region in the fourth region by the fifth impurity region in the fourth region.

Supplementary Note 4

The method according to supplementary note 3, further includes the step of:

(n) forming a seventh impurity region having the second conductivity type in the first impurity region in the fourth region;

where in the step (f), the second impurity region in the fourth region is formed in the seventh impurity region, and the second impurity region in the third region is isolated from the second impurity region and the seventh impurity region in the fourth region by the fifth impurity region in the fourth region.

What is claimed is:

1. A semiconductor device that includes a first region extending in a first direction in plan view, a second region different from the first region, a third region disposed in the first region, and a fourth region disposed in the first region so as to be adjacent to the third region in the first direction, the semiconductor device comprising:

a first impurity region having a first conductivity type in a semiconductor substrate in each of the first region and the second region;

a first trench and a second trench formed in the first impurity region in the first region and extending in the first direction;

a first gate insulating film and a second gate insulating film formed over an inner wall of the first trench and an inner wall of the second trench, respectively;

a first gate electrode formed over the first gate insulating film so as to be buried in the first trench;

a second gate electrode formed over the second gate insulating film so as to be buried in the second trench;

a second impurity region having a second conductivity type opposite to the first conductivity type in the first impurity region between the first gate electrode and the second gate electrode in the third region;

a third impurity region having the first conductivity type formed in the second impurity region in the third region;

a fourth impurity region having the second conductivity type formed in the semiconductor substrate below the first impurity region in each of the first region and the second region;

a gate potential electrode to supply a gate potential;

an emitter potential electrode to supply an emitter potential; and a collector potential electrode to supply a collector potential, wherein the first gate electrode is electrically coupled to the gate potential electrode, wherein the fourth impurity region is electrically coupled to the collector potential electrode, wherein the second impurity region, the third impurity region, and the second gate electrode are electrically coupled to the emitter potential electrode, wherein the third region comprises a first sub-region and a second sub-region that are disposed so as to be separated from one another in the first direction in the first region, wherein the fourth region is disposed between the first sub-region and the second sub-region of the third region, wherein a fifth impurity region having the first conductivity type and having a higher impurity concentration than the first impurity region is formed in the first impurity region in the fourth region, wherein an eighth impurity region having a higher impurity concentration than the first impurity region is formed in the first impurity region in the third region, wherein the second impurity region in the third region is formed in the eighth impurity region, and wherein the second impurity region and the eighth impurity region in the third region are each directly in contact with the fifth impurity region in the fourth region in the first direction.

2. The semiconductor device according to claim 1, wherein an interlayer insulating film is formed over the semiconductor substrate in each of the first sub-region and the second sub-region of the third region, wherein a plurality of first contact holes are formed in the interlayer insulating film, wherein the first contact holes each extend up to the second impurity region so as to be in contact with the second impurity region and the third impurity region, wherein a sixth impurity region having the second conductivity type and having a higher impurity concentration than the second impurity region is formed at each of positions having bottoms of the first contact holes in the second impurity region, and wherein the emitter potential electrode is formed so as to fill each of the first contact holes.

3. The semiconductor device according to claim 2, wherein the first contact holes are each formed so as to be in contact with the second gate electrode.

4. The semiconductor device according to claim 1, wherein the second impurity region is also formed in the first impurity region in the fourth region, and wherein the second impurity region in the third region is isolated from the second impurity region in the fourth region by the fifth impurity region in the fourth region.

5. The semiconductor device according to claim 4, wherein a seventh impurity region having the second conductivity type is formed in the first impurity region in the fourth region, wherein the second impurity region in the fourth region is formed in the seventh impurity region, and wherein the second impurity region in the third region is isolated from the second impurity region and the seventh impurity region in the fourth region by the fifth impurity region in the fourth region.

6. The semiconductor device according to claim 5, wherein the seventh impurity region is also formed in the first impurity region in the second region, wherein the seventh impurity region in the second region and the seventh impurity region in the fourth region are each formed up to a position deeper than a bottom of the second gate electrode, and wherein the seventh impurity region in the second region is coupled to the seventh impurity region in the fourth region in a second direction orthogonal to the first direction.

7. The semiconductor device according to claim 1, wherein the first gate electrode is branched in the fifth impurity region in the fourth region.

8. The semiconductor device according to claim 7, wherein a width of the fourth region is larger than a width of the third region in the second direction orthogonal to the first direction.

9. The semiconductor device according to claim 1, further comprising:

a fifth region adjacent to the first region with the second region in between in the second direction orthogonal to the first direction, and extending in the first direction, a sixth region disposed in the fifth region, and a seventh region disposed in the fifth region so as to be adjacent to the sixth region in the first direction, wherein the two first gate electrodes are formed in the fifth region, wherein the first impurity region is also formed in the semiconductor substrate in the fifth region, wherein the second impurity region is also formed in the first impurity region in the sixth region between the two first gate electrodes, wherein the third impurity region is also formed in the second impurity region in the sixth region, wherein the plural sixth regions are disposed so as to be separated from one another in the first direction in the fifth region, wherein the seventh region is disposed between the respective sixth regions, and wherein the fifth impurity region is also formed in the first impurity region in the seventh region.

10. The semiconductor device according to claim 1, wherein a plurality of semiconductor chips each including the semiconductor device are provided, wherein the respective emitter potential electrodes of the semiconductor chips are electrically coupled to one another, and wherein the respective collector potential electrodes of the semiconductor chips are electrically coupled to one another.

11. The semiconductor device according to claim 1, wherein impurity concentration of the fifth impurity region in the fourth region is equal to or higher than impurity concentration of the eighth impurity region in the third region.

12. The semiconductor device according to claim 1, wherein the fifth impurity region in the fourth region is an expansion of the eighth impurity region from the third region to the fourth region.

13. The semiconductor device according to claim 1, wherein the first conductivity type is an n type, and wherein the second conductivity type is a p type.

* * * * *